United States Patent [19]

Kanai et al.

[11] Patent Number: 5,482,557
[45] Date of Patent: Jan. 9, 1996

[54] DEVICE FOR FORMING DEPOSITED FILM

[75] Inventors: Masahiro Kanai, Tokyo; Masaaki Hirooka, Toride; Jun-ichi Hanna; Isamu Shimizu, both of Yokohama; Keishi Saitoh, Nara, all of Japan

[73] Assignee: Canon Kabushiki Kaisha, Tokyo, Japan

[21] Appl. No.: 305,285

[22] Filed: Sep. 14, 1994

Related U.S. Application Data

[62] Division of Ser. No. 104,497, Aug. 10, 1993, Pat. No. 5,366,554, which is a continuation of Ser. No. 989,891, Dec. 10, 1992, abandoned, which is a continuation of Ser. No. 860,211, Mar. 27, 1992, abandoned, which is a continuation of Ser. No. 441,224, Nov. 27, 1989, abandoned, which is a continuation of Ser. No. 3,048, Jan. 13, 1987, abandoned.

[30] Foreign Application Priority Data

| Jan. 14, 1986 | [JP] | Japan | 61-5979 |
| Jan. 14, 1986 | [JP] | Japan | 61-5980 |
| Jan. 14, 1986 | [JP] | Japan | 61-5981 |

[51] Int. Cl.⁶ .................................................... C23C 16/00
[52] U.S. Cl. ........................................... 118/719; 118/725
[58] Field of Search ................................. 118/719, 725

[56] References Cited

U.S. PATENT DOCUMENTS 3,652,444  2/1972  Lester ........................... 204/298

4,657,777  4/1987  Hirooka ......................... 427/248.1

FOREIGN PATENT DOCUMENTS 60-249328  12/1985  Japan ............................. 156/345
61-170568  8/1986  Japan ............................. 118/715

*Primary Examiner*—Richard Bueker
*Attorney, Agent, or Firm*—Fitzpatrick, Cella, Harper & Scinto

[57] ABSTRACT

There is disclosed a device for forming a deposited film which forms a deposited film by bringing a gaseous starting material for formation of a deposited film into contact with a gaseous oxidizing agent having the property of oxidation action on said starting material, thereby causing a chemical reaction to occur, comprising a plural number of chambers for formation of a deposited film connected to one another, said chamber having a gas releasing means having an orifice for releasing said gaseous starting material and an orifice for releasing said gaseous oxidizing agent provided respectively on both wall surfaces opposed to each other, and a support setting means which is arranged so that at least a part of its constitution may be included within the plane formed by linking mutually the gas releasing means on the both wall surfaces.

12 Claims, 12 Drawing Sheets

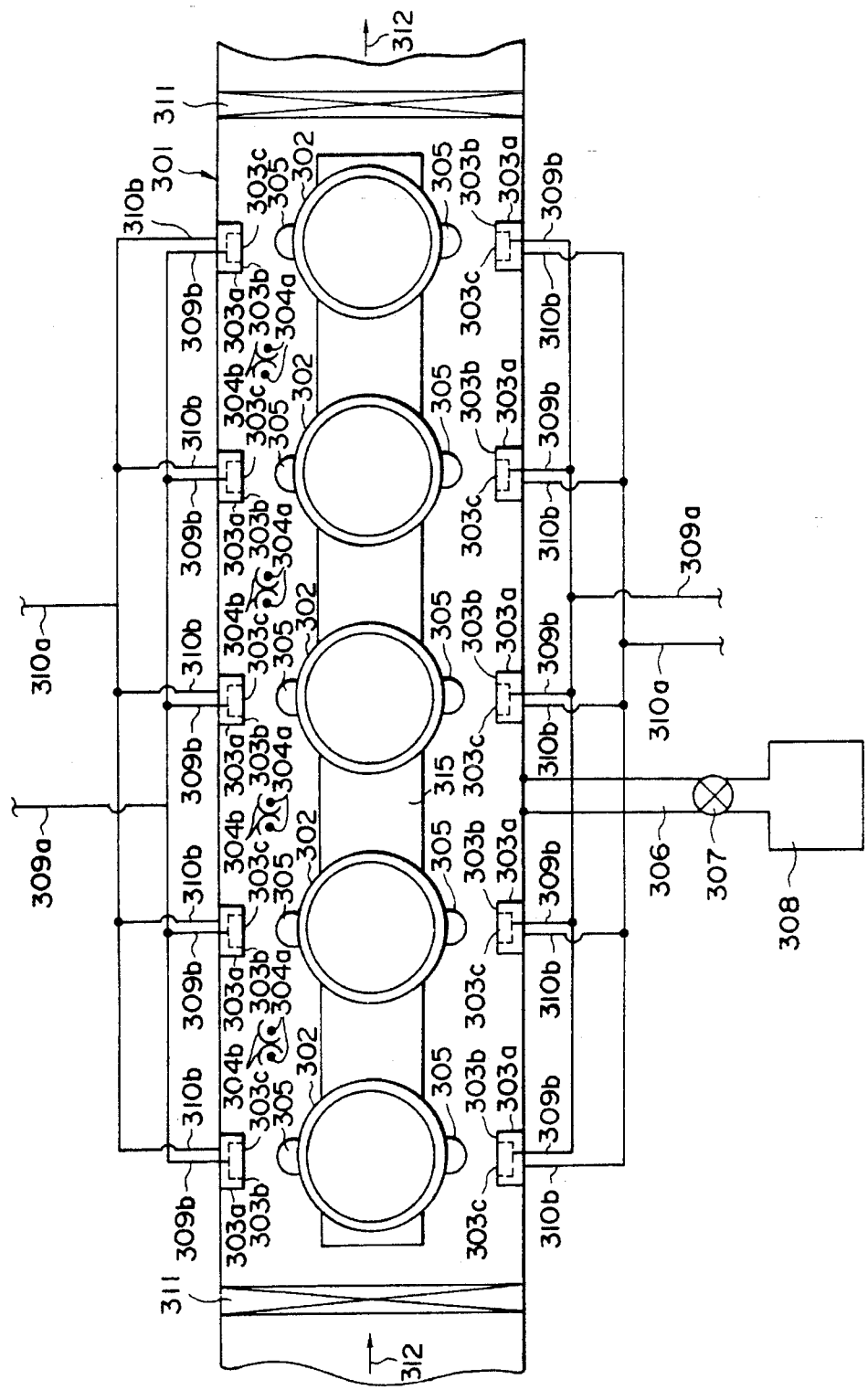

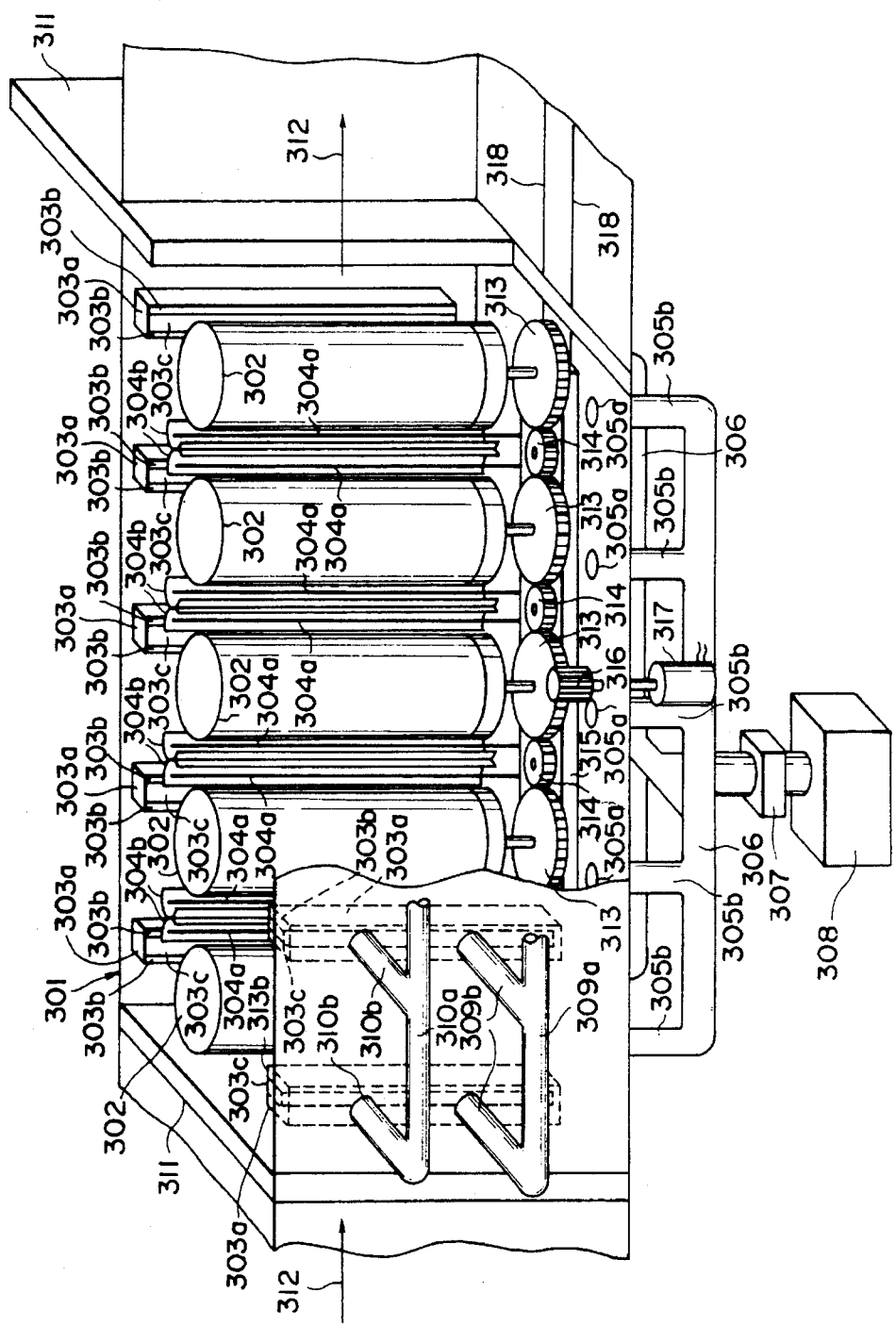

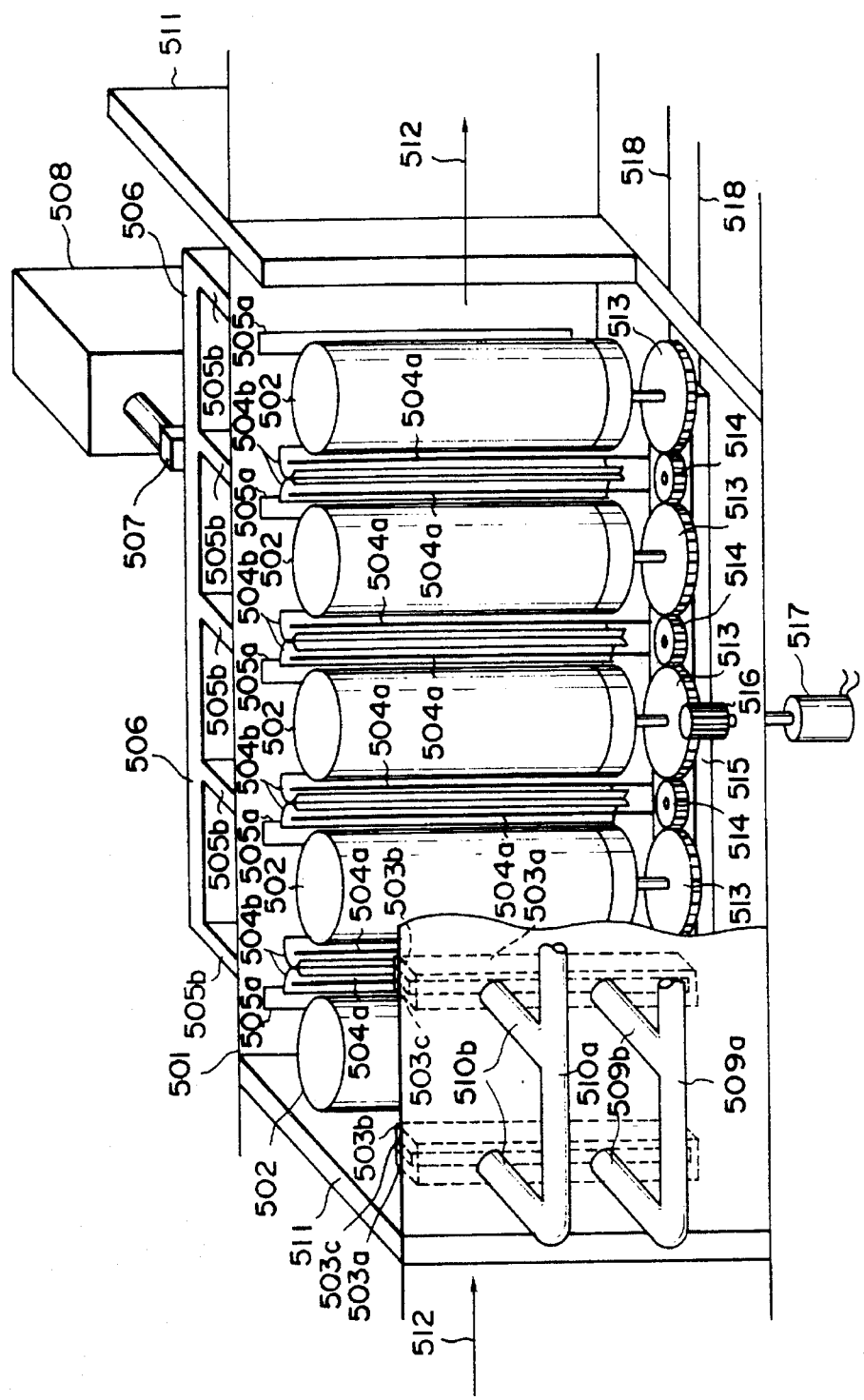

DEVICE FOR FORMING DEPOSITED FILM

This application is a division of application Ser. No. 08/104,497 filed Aug. 10, 1993, now U.S. Pat. No. 5,366,554, which is a continuation of application Ser. No. 07/989,891 filed Dec. 10, 1992, abandoned, which is a continuation of application Ser. No. 07/860,211 filed Mar. 27, 1992, abandoned, which is a continuation of Ser. No. 07/441,224 filed Nov. 27, 1989, abandoned, which is a continuation of Ser. No. 07/003,048 filed Jan. 13, 1987, abandoned.

BACKGROUND OF THE INVENTION

1. Field of the Invention

This invention relates to a device for forming functional films, particularly semiconductive deposited films useful for electronic devices such as semiconductor devices, photosensitive devices for electrophotography, light input sensor devices for optical image inputting devices, etc.

2. Related Background Art

In the prior art, for formation of functional films, especially amorphous or polycrystalline semiconductor films, suitable film forming methods have been employed individually from the standpoint of desired material characteristics, uses, etc.

For example, for formation of silicon type deposited films such as of so called non-single crystalline silicon including amorphous and polycrystalline silicon which are optionally compensated for lone pair electrons with a compensating agent such as hydrogen atoms (H) or halogen atoms (X), etc., (hereinafter abbreviated as "NON-Si (H,X)", particularly "A-Si (H,X)" when indicating an amorphous silicon and "poly-Si (H, X)" when indicating a polycrystalline silicon) (the so called microcrystalline silicon is included within the category of A-Si ( H, X ) as a matter of course ), there have been employed as attempts the vacuum vapor deposition method, the plasma CVD method, the thermal CVD method, the reactive sputtering method, the ion plating method, the optical CVD method, etc.

Particularly, as the method for forming a film of a photosensitive device for electrophotography, the plasma CVD (Chemical Vapor Deposition) method has been practicably applied.

This method comprises reducing a reaction chamber to high vacuum, feeding starting gases into the reaction chamber and thereafter decomposing the starting gases by glow discharging to thereby form a thin film on a substrate placed in the reaction chamber.

The amorphous silicon (A-Si) film formed by use of a silane gas such as $SiH_4$, $Si_2H_6$, etc. as a starting gas according to this method is relatively fewer in the localized level existing in the forbidden band of amorphous silicon (A-Si), and therefore not only valence electron control is possible by doping of a substitution type impurity but also it has excellent characteristics as a film of an electrophotographic photosensitive member.

FIG. 1 shows the basic constitution of the main portion of a preferred embodiment of a bulk production type vacuum film forming device for the plasma CVD method disclosed in the Patent Application already filed by the same applicant (U.S. patent application Ser. No. 491,799). Film formation on a cylindrical substrate surface according to this device is described in detail below.

111 is an intake chamber (substrate setting stage) for setting a cylindrical substrate 141 at a predetermined position, and by opening the door 115, one or a plural number of cylindrical substrates 141 are fixed on a fixing member 116. The door 115 is closed, and the intake chamber 111 is internally reduced in pressure to a desired pressure by an evacuation system 131, and the cylindrical substrates 141 are heated by a heater 124 for heating the substrate to, for example, about 200° to 300° C. After the temperature is sufficiently stabilized, the cylindrical substrates 141 are moved by a conveying means 117 into a relay chamber (relay stage) 112 maintained at a desired vacuum pressure by an evacuation system 142 by opening the intermediate gate valve 119. After movement, the gate valve is closed, and the gate valves 129 provided in the same number as the cylindrical substrates 141 are opened, and the cylindrical substrates 141 are descended by a vertically moving means 118, and the respective cylindrical substrates 141 are moved into a plural number of reaction furnaces (film forming stage) 141-1, 141-2 provided corresponding to the respective gate valves.

After the respective cylindrical substrates 141 are fixed on the respective receiving members 127 for cylindrical substrates rotatable by means of driving sources 137, the vertical moving means 118 is returned to the original position.

After the respective gates 129 are closed, the inner pressures of the reaction furnaces 114-1 and 114-2 are controlled appropriately as desired by means of an evacuation system 132 for the reaction furnaces 114-1 and 114-2 and an introduction system 134 of starting gases for formation of films such as silane, etc., and then high frequency voltage is applied on the substrates and coaxial cylindrical electrodes 126 by a high frequency power source 133 to generate plasma by discharging in the reaction furnaces 114-1 and 114-2 and decompose the starting gas such as silane introduced by the introduction system 134, thereby forming amorphous silicon films, etc., on the surfaces of the cylindrical substrates 141. During this operation, the cylindrical substrates 141 are heated internally by heaters 128, and rotated by the driving sources 137 to effect uniformization of film thickness. The plasma generated by discharging is confined by electrical shields 125 in the predetermined spaces in the reaction furnaces 114-1 and 114-2.

After completion of the film formation step, introduction of starting gases is stopped simultaneously with turning off the high frequency power source, and then, with the gate valves 129 being held up, the plural number of respective cylindrical substrates 141 having films formed thereon are drawn up by means of the vertical moving means 118 into the relay chamber 112, and thereafter the gate valves 129 are closed. Next, the gate valve 120 is opened, and the respective cylindrical substrates 141 having films formed thereon are moved by means of a conveying means 121 to a take-out chamber (substrate removing stage) 113 previously reduced in pressure to a predetermined pressure. After completion of movement, the gate valve 120 is closed again. The cylindrical substrate 141 moved to the take-out chamber 113 is cooled to a predetermined temperature under a predetermined reduced pressure by cooling action of the cooling plate 123 cooled by a cooling means 136. Then, the leak valve 139 is opened gradually so that no bad influence may be exerted on the film formed, and the take-out chamber 113 is communicated internally to the outer atmosphere and thereafter the take-out door 122 is upheld to take out the cylindrical substrates 141 having films formed thereon to the outside.

By repeating the film forming actuation steps as described above, film formation on a large number of substrates has been continuously practiced.

As described above, according to the plasma CVD method of the prior art, it has been necessary to introduce high frequency power onto cylindrical substrates and coaxial cylindrical electrodes in the reaction chamber in order to make electrical properties of deposited films and film thicknesses uniform.

For this reason, it has not been easy to form deposited films on one or more cylindrical substrates at the same time in the reaction chamber, and therefore the prior art technique was not without problem when productivity was required to be dramatically improved.

Also, when cylindrical substrates are used, as a measure to carry out film formation stably and with good efficiency according to the plasma CVD method, electrodes arranged concentrically relative to the cylindrical substrates are used in the reaction chamber. In this case, the deposited films are deposited on both of the cylindrical substrates and the coaxial cylindrical electrodes to film thicknesses of the same extent, whereby only a part of the starting gases could be deposited on the desired cylindrical substrates. Accordingly, the utilization efficiency of the starting gases was low to involve the problem that the cost of the deposited film was high.

Further, according to the plasma CVD method, film formation is effected by decomposition of the starting gases by the high frequency energy introduced externally, and therefore the high frequency can not be easily introduced into the reaction chamber with good efficiency, thus posing a problem that the production cost cannot be made further lower with ease.

Further, some problems have existed in operation of the steps, and also in installation investment. As to operation of the steps, for example, many parameters involved pose a problem for the following reasons. That is, referring to film forming parameters such as mutual relationships between substrate temperature, flow rates and flow rate ratios of the gases introduced, pressure during film formation, high frequency power, electrode structure, structure of reaction vessel, evacuation speed, plasma generating system, etc., there already exist a large number of parameters. In addition, other parameters also exist. Accordingly, for obtaining a deposited film of a desired quality, it is required to select the parameters and set their values strictly. And, because of the parameters strictly selected, if one of them, particularly the parameter concerned with formation of plasma is changed, namely the plasma state becomes unstable, the film formed will be badly influenced markedly, resulting sometimes in difficult utilization of the film depending on the use. And, as to the device design, since strict selection of the parameters is required as mentioned above, the structure becomes complicated of itself, and the design must be made so as to correspond to the parameters individually strictly selected according to the change in the scale, the kind of the device. For such reasons, the plasma CVD method, although it has been accepted presently the best method, involves the problems such that enormous installation investment is required for the device when stable bulk production of A-Si films having desired characteristics is desired to be performed and, in addition, that the management items of the steps are so many and complicated as described above and consequently it is difficult to lower the cost.

On the other hand, for example, photosensitive devices for electrophotography have become diversified and it is socially demanded that photosensitive devices for electrophotography constituted of stable A-Si films corresponding to the objects, uses to be applied while satisfying wholly the requirements such as various characteristics, etc. should be supplied steadily at low cost. There is the situation where development of the method and the device satisfying this demand is earnestly desired.

These are also applicable to film formation of other layers such as NON-Si (H,X) films containing at least one kind selected from among oxygen atoms, carbon atoms and nitrogen atoms.

Further, in the case of preparing a semiconductor device with a multi-layer structure, the interfaces formed between the respective layers may sometimes become the factor which worsens the characteristics of the semiconductor device obtained. For example, to refer to a photosensitive member for electrophotography as an example, it has a multi-layer structure having a long wavelength light absorbing layer (first layer, amorphous silicon germanium layer controlled in band gap to narrower by containment of Ge) 201, a charge injection preventive layer (second layer, amorphous silicon layer doped with B) 202, a photosensitive layer (third layer, amorphous silicon layer not doped) 203 and a surface protective layer (fourth layer, amorphous silicon carbide layer) 204 laminated on a substrate 200 made of aluminum, as shown in FIG. 2. Since the kinds, the flow rates of the starting gases or the discharging intensities of plasma for formation of the respective layers are extremely different, efforts have been made to reduce the influence of the interfaces formed between the respective layers generally by exchanging completely gases by stopping discharging between the first layer and the second layer, between the second layer and the third layer and between the third layer and the fourth layer, or by providing a varied layer formed by varying the gas species, flow rates or discharging intensities of plasma continuously and gradually. However, in any case, it has been demanded to change and improve interface characteristics further satisfactorily.

As described above, in formation of silicon type deposited films, the points to be solved still remain and it has been desired earnestly to develop a device for forming deposited film which is capable of bulk production by effecting energy-saving with a further lowered cost while maintaining its practicably utilizable characteristics and uniformity, and can also improve further the interface state of a deposited film with a multi-layer structure for photosensitive devices for electrophotography, etc.

SUMMARY OF THE INVENTION

An object of the present invention is to remove the points to be improved possessed by a device for forming deposited film of the prior art as described above and at the same time provide a device capable of producing an electronic device such as photosensitive device for electrophotography, etc. utilizing a novel method for forming deposited film without use of the formation method of the prior art.

Another object of the present invention is to provide a device for forming deposited film capable of forming continuously a deposited film with a multilayer structure improved in interface characteristic having uniform characteristics over a large area without use of plasma reaction with easy management of film quality simultaneously with achievement of energy-saving.

Still another object of the present invention is to provide a device for forming deposited film which can give easily deposited films with multi-layer structure, having excellent productivity, bulk productivity, high quality as well as excellent physical characteristics such as electrical, optical, semiconductor characteristics, etc.

BRIEF DESCRIPTION OF THE DRAWINGS

FIG. 3(A) illustrates schematically a segmentary top view of the device for forming deposited film according to a first embodiment of the present invention.

FIG. 3(B) illustrates schematically a perspective view of the device for forming deposited film shown in FIG. 3(A).

FIG. 5(B) illustrates schematically a perspective view of the device for forming deposited film shown in FIG. 5(A).

DETAILED DESCRIPTION OF PREFERRED EMBODIMENTS

Figure 1:
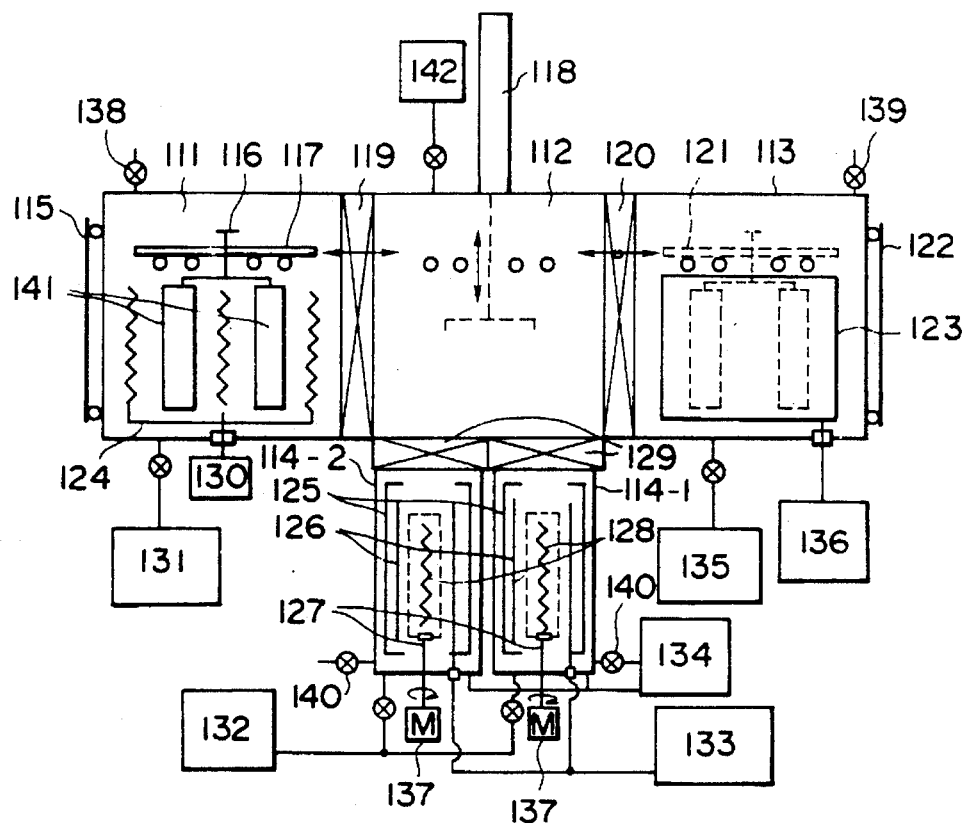
FIG. 1 illustrates schematically a device for producing a photosensitive device for electrophotography according to the plasma CVD.

First, for better understanding of the device for forming deposited film, the method for forming deposited film to be applied for said device is described.

The above method for forming deposited film comprises basically feeding a gaseous starting material (A) for the starting material for formation of deposited film, optionally together with a gaseous material (D) containing a component for valence electron controller and/or band gap controller, and a gaseous oxidizing agent having the property of oxidation action on these materials separately into a reaction space, thereby causing a chemical reaction to occur and form a deposited film on a desired substrate. This method for forming deposited film is hereinafter called the FOCVD method.

In the above FOCVD method, the gaseous starting material (A) for formation of deposited film to be used and the gaseous material (D) receive oxidation action through contact with the gaseous oxidizing agent, and may be selected suitably depending on the kind, the characteristics, uses of the desired deposited film. The above gaseous starting material (A), the gaseous material (D) and the gaseous oxidizing agent may be those which can be made gaseous when introduced into a reaction space to be contacted, and may be either gaseous, liquid or solid under ordinary state.

When the starting material (A) for formation of deposited film, the gaseous material (D) or the oxidizing agent is liquid or solid under ordinary state, it is introduced in gaseous state into the reaction space while performing bubbling with the use of a carrier gas such as Ar, He, $N_2$, $H_2$, etc. optionally with application of heat.

During this operation, the partial pressures and mixing ratio of the above gaseous starting material (A), the gaseous material (D) and the gaseous oxidizing agent may be set by controlling the flow rate of the carrier gas or the vapor pressures of the starting material (A) for formation of deposited film and the gaseous oxidizing agent.

As the starting material (A) for formation of a deposited film, for example, if semiconductive or electrically insulating silicon type deposited films are desired to be obtained, straight chain and branched chain silane compounds, cyclic silane compounds may be employed as effective ones.

Specifically, examples of straight chain silane compounds may include $Si_nH_{2n+2}$ ($\underline{n}$=1, 2, 3, 4, 5, 6, 7, 8), examples of branched chain silane compounds include $SiH_3SiH(SiH_3)SiH_2SiH_3$, and examples of cyclic silane compounds may include $Si_nH_{2n}$ ($\underline{n}$=3, 4, 5, 6), etc.

Of course, these starting materials may be used either as a single kind or as a mixture of two or more kinds.

The gaseous oxidizing agent to be used in the present invention is to be gaseous when introduced into the reaction space and at the same time to have the property of effectively oxidizing the gaseous starting material (A) for formation of deposited film introduced into the reaction space by mere contact therewith, including oxygen type oxidizing agents, nitrogen type oxidizing agents, halogen type oxidizing agents. Specifically, there may be employed oxygens such as air, oxygen, ozone, etc., oxygen or nitrogen compounds such as $N_2O_4$, $N_2O_3$, $NO_2$, NO, etc., peroxides such as $H_2O_2$, halogen gases such as $F_2$, $Cl_2$, $Br_2$, $I_2$, ClF, etc., as effective ones.

These oxidizing agents are introduced into the reaction space under gaseous state together with the starting material (A) for formation of deposited film and the above material (D) as described above with desired flow rates and feeding pressures being given, wherein they are mixed with and collided against the above starting material (A) and the above material (D) to cause chemical reactions, thereby oxidizing the above starting material (A) and the above material (D) to generate efficiently a plural kinds of precursors containing precursors under excited state. Of the precursors under excited state and other precursors, at least one functions as the feeding source for the constituent of the deposited film formed.

The precursors generated may undergo decomposition or reaction to be converted to other precursors under excited state or to precursors under other excited state, or alternatively in their original forms although, if desired, releasing energy to contact the substrate surface arranged in a film forming space, whereby an amorphous deposited film with a three-dimensional network structure is prepared when the substrate surface temperature is relatively lower, or a crystalline deposited film is prepared when the substrate surface temperature is relatively high.

In the method of the present invention, as the material (D) containing a component for valence electron controller and/or band gap controller as the constituent, it is preferable to select a compound which is gaseous under normal temperature and normal pressure, or at least gaseous under the conditions for formation of deposited film and can be readily gasified by a gasifying device.

The material (D) to be used in the present invention may include, in the case of silcion type semiconductor films, p-type valence electron controller, namely compounds containing elements of the group III of the periodic table functioning as the so-called p-type impurity such as B, Al, Ga, In, Tl, etc., and n-type valence electron controller, namely compounds containing elements of the group V of the periodic table functioning as the so-called n-type impurity such as N, P, As, Sb, Bi, etc.

Specifically, there may be included $NH_3$, $HN_3$, $N_2H_5N_3$, $N_2H_4$, $NH_4N_3$, $PH_3$, $P_2H_4$, $AsH_3$, $SbH_3$, $BiH_3$, $B_2H_6$, $B_4H_{10}$, $B_5H_9$, $B_5H_{11}$, $B_6H_{10}$, $B_6H_{12}$, $Al(CH_3)_3$, $Al(C_2H_5)_3$, $Ga(CH_3)_3$, $In(CH_3)_3$, etc. as effective ones. These valence electron controllers can also be used as the band gap controllers when added in large amounts.

In the case of silicon type deposited films, the compounds containing the so called band gap expanding element as one kind of band gap controllers may include carbon containing compounds, oxygen containing compounds and nitrogen containing compounds, etc.

Specifically, as the carbon containing compounds, there may be employed, for example, chain or cyclic hydrocarbon compound and chain or cyclic hydrocarbons of which a part or all of the hydrogen atoms are substituted with halogen atoms, including typically saturated and unsaturated hydrocarbons represented by $C_nH_{2n+2}$ (n is an integer of 1 or more), $C_nH_{2n-2}$ (n is an integer of 1 or more) and $C_nH_{2n}$ (n is an integer of 1 or more) such as methane ($CH_4$), ethane ($C_2H_6$), propane ($C_3H_8$), n-butane (n-$C_4H_{10}$), pentane ($C_5H_{12}$); as ethylenic hydrocarbons, ethylene ($C_2H_4$), propylene ($C_3H_6$), butene-1 ($C_4H_8$), butene-2 ($C_4H_8$), isobutylene ($C_4H_8$), pentene ($C_5H_{10}$); as acetylenic hydrocarbons, acetylene ($C_2H_2$), methylacetylene ($C_3H_4$), butyne ($C_4H_6$), etc., or chain halogenated carbons represented by $C_uY_{2u+2}$ (u is an integer of 1 or more, Y is at least one element selected from F, Cl, Br and I), cyclic halogenated carbons represented by $C_vY_{2v}$ (v is an integer of 3 or more, Y has the same meaning as above), chain or cyclic carbon compounds represented by $C_uH_xY_y$ (u and Y have the meanings as above; x+y=2u or 2u+2), etc.

These carbon compounds may be used either as a single compound or as a combination of two or more compounds.

Examples of oxygen containing compounds may include $O_2$, $CO_2$, $NO$, $NO_2$, $N_2O$, $O_3$, $CO$, $H_2O$, $CH_3OH$, $CH_3CH_2OH$, etc.

Examples of nitrogen containing compounds may include $N_2$, $NH_3$, $N_2H_5N_3$, $N_2H_4$, $NH_4N_3$, etc.

In the case of silicon type deposited films, as the compound containing the so called band gap reducing element as one kind of the band gap controllers, there may be included, for example, germanium compounds, tin compounds, etc. as effective ones.

Specifically, as the compounds containing germanium as the main skeleton, there may be employed, for example, chain or cyclic hydrogenated germanium compounds and chain or cyclic germanium compounds of which a part or all of the hydrogen atoms are substituted with halogen atoms, including typically $Ge_sH_{2s+2}$ (S=1, 2, 3, 4, 5, 6), $Ge_tH_{2t}$ (t=3, 4, 5, 6), chain halogenated germanium represented by $Ge_uY_{2u+2}$ (u is an integer of 1 or more, Y is at least one element selected from F, Cl, Br and I), cyclic halogenated germanium represented by $Ge_vY_{2v}$ (v is an integer of 3 or more and Y has the same meaning as above), chain or cyclic compounds represented by $Ge_uH_xY_y$ (u and Y have the same meanings as above; x+y=2u or 2u+2), etc. As tin compounds, for example, hydrogenated tin such as $SnH_4$, etc. may be employed.

For introducing the gas of the above material (D) into the reaction space, it can be previously mixed with the above starting material (A) for formation of deposited film before introduction, or introduced from a plural number of independent gas feeding sources.

In the present invention, so that the deposit film forming process may proceed smoothly to form a film of high quality and having desired physical characteristics, as the film forming factors, the kinds and combination of the starting material (A), the material (D) and the oxidizing agent, mixing ratio of these, pressure during mixing, flow rate, the inner pressure in the film forming space, the flow types of the gases, the film forming temperature (substrate temperature and atmosphere temperature) are suitably selected as desired. These film forming factors are organically related to each other, and they are not determined individually but determined respectively under mutual relationships.

In the present invention, the ratio of the gaseous starting material (A) for formation of a deposited film and the gaseous halogenic oxidizing agent introduced into the reaction space may be determined suitably as determined in relationship of the film forming factors related among the film forming factors as mentioned above, but it is preferably $1/20$ to $100/1$, more preferably $1/5$ to $50/1$ in terms of flow rate ratio introduced.

The ratio of the gaseous material (D) may be set as desired corresponding to the kind of the above gaseous starting material (A) and the desired semiconductor characteristics of the deposited film prepared, but at a ratio relative to the above gaseous starting material (A) preferably of $1/1000000$ to $1/10$, more preferably $1/100000$ to $1/20$, optimally $1/10000$ to $1/50$, when valence electron control is intended.

When band gap control is intended, it is used at a ratio relative to the above starting material (A) preferably of $1/10000$ to $1000/1$, more preferably $1/1000$ to $500/1$, optimally $1/100$ to $100/1$.

The pressure during mixing when introduced into the reaction space may be preferably higher in order to enhance higher the chemical contact between the above gaseous starting material (A) and the gaseous material (D) with the above gaseous oxidizing agent in probability, but it is better to determine the optimum value suitably as desired in view of the reactivity. Although the pressure during mixing may be determined as described above, each of the pressure during introduction may be preferably $1\times10^{-7}$ atom to 5 atom, more preferably $1\times10$ atom to 2 atom.

The pressure within the film forming space connected spatially to the reaction space, namely the pressure in the space in which the substrate for film formation on its surface is arranged may be set suitably as desired so that the precursors (E) under excited state generated in the reaction space and sometimes the precursors (F) formed as secondary products from said precursors (E) may contribute effectively to film formation.

The pressure in the film forming space may be determined in the relationship with the introduction pressures of the gaseous starting material (A), the gaseous material (D) and the gaseous oxidizing agent introduced into the reaction space, but it is preferably 0.001 Torr to 100 Torr, more preferably 0.01 Torr to 30 Torr, optimally 0.05 Torr to 10 Torr.

As the substrate temperature (Ts) during film formation, it can be set suitably as desired individually depending on the gas species employed and the kinds and the required characteristics of the deposited film formed, but, in the case of obtaining an amorphous film, it is preferably from room temperature to 450° C., more preferably from 50° to 400° C.

Particularly, in the case of forming a silicon deposited film with better semiconductor characteristics and photoconductive characteristics, etc., the substrate temperature (Ts) should desirably be made 70° to 400° C. On the other hand, in the case obtaining a polycrystalline film, it should preferably be 200° to 700° C., more preferably 300° to 600° C.

As the atmosphere temperature (Tat) in the film forming space, it may be determined suitably as desired in relationship with the substrate temperature (Ts) so that the above precursors (E) generated and the above precursors (F) are not changed to unsuitable chemical species for film formation, and also the above precursors (E) may be efficiently generated.

The substrate to be used in the present invention may be either electroconductive or electrically insulating, provided that it is selected as desired depending on the use of the deposited film formed. As the electroconductive substrate, there may be mentioned metals such as NiCr, stainless steel, Al, Cr, Mo, Au, Ir, Nb, Ta, V, Ti, Pt, Pd, etc. or alloys thereof.

As insulating substrates, there may be conventionally used films or sheets of synthetic resins, including polyester, polyethylene, polycarbonate, cellulose acetate, polypropylene, polyvinyl chloride, polyvinylidene chloride, polystyrene, polyamide, etc., glass, ceramics, and so on. At least one side surface of these substrates is preferably subjected to treatment for imparting electroconductivity, and it is desirable to provide other layers on the side at which said electroconductive treatment has been applied.

For example, electroconductive treatment of a glass substrate can be effected by providing a thin film of NiCr, Al, Cr, Mo, Au, Ir, Nb, Ta, V, Ti, Pt, Pd, $In_2O_3$, $SnO_2$, ITO ($In_2O_3 + SnO_2$) thereon. Alternatively, a synthetic resin film such as polyester film can be subjected to the electroconductive treatment on its surface by vacuum vapor deposition, electron-beam deposition or sputtering of a metal such as NiCr, Al, Ag, Pb, Zn, Ni, Au, Cr, Mo, Ir, Nb, Ta, V, Ti, Pt, etc., or by laminating treatment with said metal, thereby imparting electroconductivity to the surface.

The substrate should be preferably selected from among those set forth above in view of adhesion and reactivity between the substrate and the film. Further, if the difference in thermal expansion between both is great, a large amount of strains may be created within the film to give sometimes no film of good quality, and therefore it is preferable to use a substrate so that the difference in thermal expansion between both is small.

Also, the surface state of the substrate is directly related to the structure of the film (orientation) or generation of stylet structures, and therefore it is desirable to treat the surface of the substrate to give a film structure and a film texture so that desired characteristics may be obtained.

In the present invention, the geometrical arrangement of the gas releasing hole, the substrate and the gas evacuating hole is determined so that during introduction of the above starting material (A) for formation of deposited film, the material (D) and the oxidizing agent, these may be mixed uniformly and with good efficiency to form the above precursors (E) efficiently and effect film formation without trouble.

In the present invention, both of the opposed wall surfaces are provided with gas releasing holes, and a substrate is set on within the flat plane linking these holes. By practicing these arrangements, the gas flow is directed from both right and left directions toward the substrate surface with the substrate as the center. Accordingly, deposition speed can be accelerated or uniformity in film thickness and film quality can be improved as compared with the case of forming a deposited film only from one direction. And, this geometrical arrangement can be provided in a plural number of pairs in the same chamber for forming deposited film to maintain fully its effect, provided that the planes linking the respective gas releasing holes are not crossed with each other. For improvement of uniformity in film thickness and film quality, the evacuating holes for gas should be preferably set on the wall surfaces opposed to the upper portion and/or the lower portion of the substrate set in the chamber for forming deposited film. Of course, when a plural number of substrates are set, they should preferably be arranged on the wall surfaces opposed to the upper portions and/or the lower portions of the respective substrates.

In the present invention, although it is possible to form a deposited film with a multi-layer structure having satisfactory characteristics in one chamber for forming deposited film, it is preferable to connect a plural number of chambers for forming deposited film and form the respective deposited layers in separate chambers for forming deposited films for accomplishing further change and improvement in interface characteristics as mentioned above.

In the present invention, the starting gas for formation of deposited film remains in the chamber for forming deposited film in a relatively small amount, but the influence of the starting gas remaining in the preceding chamber for forming deposited film can be lowered to a limit by changing the chamber for forming deposited film for respective deposited layers, whereby change and improvement in interface characteristics can be dramatically accomplished.

For practicing continuous production of, for example, photosensitive devices for electrophotography having deposited film with multi-layer constitution by use of the device for forming deposited film of the present invention, the substrate is set so that the moving direction may be one direction. For example, the chamber for forming a deposited film which becomes the first layer nearest to the substrate is connected first and next the chamber for forming a deposited film which becomes the second layer. Subsequently, the chamber for forming a deposited film nearer to the substrate is connected successively in the same manner to constitute the device for forming deposited film. For formation by means of said device, the substrate may be moved continuously to have deposited films laminated thereon. Of course, before the chamber for formation of a deposited film of the first layer, a pre-treatment chamber may be also connected, and further a post-treatment chamber after the chamber for formation of a deposited film of the final layer.

The device for forming deposited film according to the present invention is described in more detail by referring to the drawings, but the device for forming deposited film of the present invention is not limited by these.

FIG. 3(A) illustrates schematically a segmentary top view of the device for forming deposited film according to a first embodiment of the present invention, and FIG. 3(B) its perspective view.

In FIG. 3(A), 3(B), the respective portions indicated by the symbols have the following names.

301 is a chamber for forming deposited film; 302 a cylindrical support; 303a gas releasing means; 303b and 303c are gas releasing orifices; 304a are halogen lamps for heating substrate; 304b reflection mirrors; 305 and 305a are gas evacuating holes; 305b are gas discharging pipes; 306 a gas collective evacuating pipe; 307 a main valve for vacuum; 308 an evacuating device; 309a and 310a are gas feeding pipes; 309b and 310b gas introducing pipes; 311 are gate valves; 312 the direction of substrate flow; 315 a receiving stand for conveying substrate; 313 rotating implements; 314 and 316 are gears for rotation; 317 is a motor for driving; and 318 a rail for conveying.

The device for forming deposited film shown in FIG. 3(A) and (B) has five cylindrical substrates 302 made of aluminum, five pairs of gas releasers 303a on the wall surfaces so as to sandwich said cylindrical substrates between the respective pairs, gas evacuating holes 305a on the wall surface opposed to the lower part of the cylindrical substrates 302 made of aluminum, halogen lamps 304a for heating the substrates, reflection mirrors 304b, and a receiving stand 315 for conveying substrate arranged in a rectangular chamber 301 for formation of deposited film, which is separated from the adjacent chamber for formation of deposited film by a gate valve 311. The gaseous starting material (A) and the starting material (D) from the bombs (not shown) pass through the gas feeding pipe 309a and the gas introducing pipes 309b, and released through the gas releasing orifices 303c, while the gaseous oxidizing agent from the bomb (not shown) passes through the feeding pipe 310a and the gas introducing pipes 310b, and is released through the 5 pairs of gas releasing orifices 303b toward the direction of the substrates 302, and evacuated by means of the gas evacuating device 308 from the gas evacuating holes 305a provided below the cylindrical substrates 302 made of aluminum, passing through the gas evacuating holes 305a, the gas evacuating pipes 305b, the gas collective evacuating pipe 306 and the main vacuum valve 307.

After completion of film formation, the receiving stand 315 for conveying the substrate carrying the substrates 302 is conveyed on the rail for conveying 318 toward the direction 312 shown by the arrowhead.

The cylindrical substrates 302 are held on the rotating implements 313 and can be rotated through the gears 316 and 314 by the motor 317 for driving externally provided.

In the present invention, for mixing the gaseous material (A) and the gaseous oxidizing agent uniformly and stably with good efficiency in the longer direction of the substrate, it is necessary to set arrangement of the gas releasing orifice so as to release the respective gases alternately.

Figure 4:
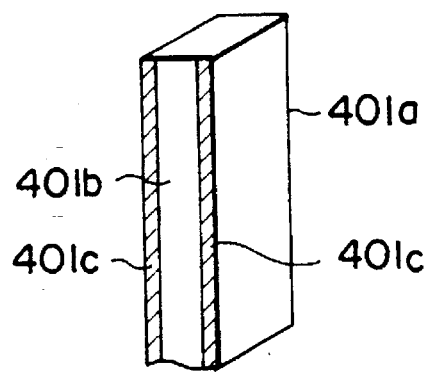
FIG. 4 illustrates schematically the gas releaser used in the embodiments of the present invention.
Figure 4:
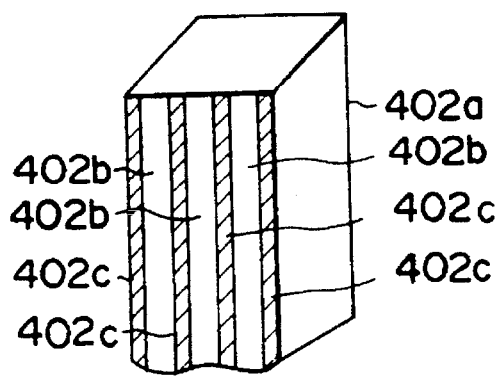
Figure 4:
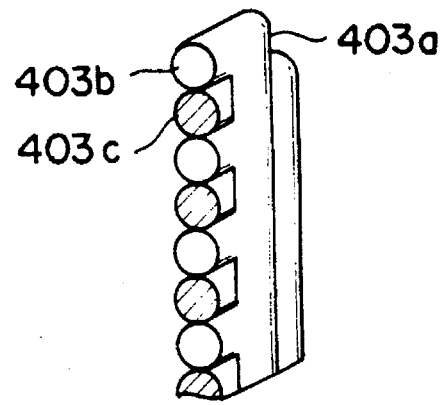
Figure 4:
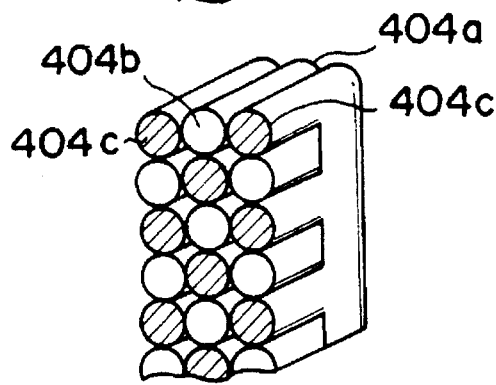

FIG. 4 shows a preferable embodiment.

401a—404a are main gas releasers, having gas releasing orifices 401b—404b and gas releasing orifices 401c—404c (shown by dashed lines) arranged alternately. FIG. 4(1) has three rows of slit-like releasing orifices juxtaposed, in the form having the gas releasing orifice 401b sandwiched between the gas releasing orifices 401c. The slit width may be preferably 0.01 to 50 mm, more preferably 0.02 to 30 mm, optimally 0.03 to 10 mm. FIG. 4(2) shows increased number of arrangement shown in (1), which is effective for film formation on a substrate of a great size or accelerating the speed of deposition. The number of slit is determined conveniently as desired.

The slit length is determined conveniently depending on the length of the substrate.

FIG. 4(3) shows an arrangement of circular releasing orifices juxtaposed in a row alternately in the longitudinal direction. FIG. 4(4) shows an arrangement of circular releasing orifices juxtaposed in rows alternately in the longitudinal and lateral directions, which is effective for film formation on a substrate of a great size or accelerating the deposition speed. The diameter of the releasing orifice should be desirably made 0.01 to 100 mm, more preferably 0.05 to 50 mm, optimally 0.1 to 30 mm.

The slit-like and circular releasing orifices may be arranged either adjacent to each other or with intervals, but it is not desirable to arrange them at intervals of 10-fold or longer of the slit width or the diameter.

Regardless of the gas species released respectively from the gas releasing orifices 401b—404b and 401c—404c, the film quality of the deposited film will not be essentially changed.

The distance between the gas releasing orifices and the substrate surface is determined appropriately in view of the kinds of the deposited films formed, the characteristics desired therefor, gas flow rates, inner pressures in the vacuum chambers, etc., but preferably several mm to 20 cm, more preferably about 5 mm to 15 cm.

Figure 5A:
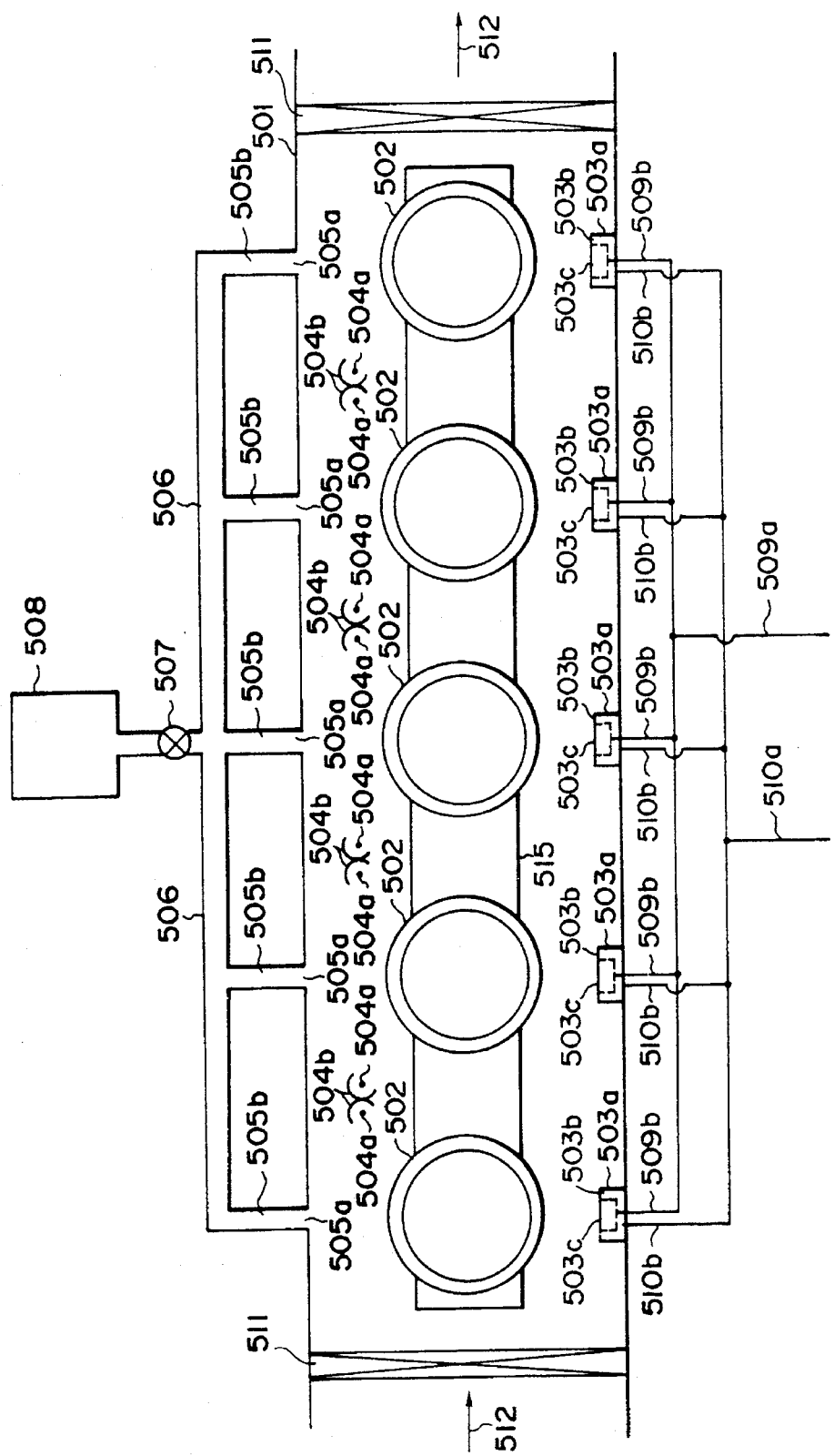
FIG. 5(A) illustrates schematically a segmentary top view of the device for forming deposited film according to a second embodiment of the present invention.

FIG. 5(A) illustrates schematically a segmentary top view of the device for forming deposited film according to a second embodiment of the present invention and FIG. 5(B) its perspective view.

In FIG. 5(A), (B), the respective portions indicated by the symbols have the following names.

501 is a chamber for forming deposited film; 502 cylindrical substrates, 503a gas releasers; 503b and 503c are gas releasing orifices; 504a are halogen lamps for heating substrates; 504b reflection mirrors; 505a gas evacuating holes; 505b gas discharging pipes; 506 a gas collective evacuating pipe; 507 a main vacuum valve; 508 an evacuating device; 509a and 510a are gas feeding pipes; 509b and 510b gas introducing pipes; 511 gate valves; 512 the flow of substrate; 515 a receiving stand for conveying substrate; 513 rotating implements; 514 and 516 are gears for rotation; 517 is a motor for driving; 518 a rail for conveying.

The device for forming deposited film shown in FIG. 5(A) and (B) has five pairs of cylindrical substrates 502 made of aluminum, gas releasers 503a, gas evacuating holes 505a, halogen lamps 504a for heating substrates, reflection mirrors 504b, and a receiving stand 515 for conveying substrates arranged within a rectangular chamber 501 for formation of deposited film, which is separated from the adjacent chambers for forming deposited film by gate valves 511. The gaseous starting material (A) and the starting materail (D) from the bombs (not shown) pass through the gas feeding pipe 509a and the gas introducing pipes 509b to be released through the gas releasing orifices 503c, while the gaseous oxidizing agent from the bomb (not shown) passes through the gas feeding pipe 510a and the gas introducing pipes 510b to be released through the gas releasing orifices 503b, respectively, toward the substrates 502, and further evacuated by means of the evacuating device 508 through the gas evacuating holes 505a provided on the opposed wall surfaces, passing through the gas evacuating pipes 505b, the gas collective evacuating pipe 506, and the main vacuum valve 507.

After completion of film formation, the receiving stand 515 for conveying substrate carrying the substrates 502 is conveyed on the rail for conveying 518 in the direction 512 shown by the arrowhead.

The cylindrical substrates 502 are held on the rotating implements 513 and can be rotated through gears 516 and 514 for rotation by means of a motor 517 for driving provided externally.

Also, in the device shown in FIG. 5(A), (B), for mixing the gaseous starting material and the gaseous oxidizing agent uniformly and stably with good efficiency in the longer direction of the substrate, it is necessary to arrange the gas releasing orifices so as to release the respective gases alternately. A preferable example is shown in FIG. 4 as described above.

A third embodiment of the device for forming deposited film of the present invention is described by referring to the schematic illustrations shown in FIG. 6 to FIG. 9(B).

The respective portions in FIG. 6 to FIG. 9(B) have the following names.

600 is a device for formation of deposited film; 601 and 701 are chambers for gateway of cylindrical substrates; 602 and 702 first layer deposited chambers; 603 and 703 second layer deposited chambers; 604 and 704 third layer deposited chambers; 605a, 605b, 605c, 605d, and 705 gate valves; 606 is a gas releasing means; 607 and 905 pipes for feeding gaseous halogenic oxidizing agent; 608, 609, 610 and 906 pipes for feeding gaseous starting materials for formation of deposited film; 611 are evacuating holes; 612 IR-lamps for heating support; 613 and 810 are cylindrical supports; 706 and 812 cylindrical support conveying stands; 707, 708, 709, 703 receivers for cylindrical support conveying stands; 710 and 704 gears for driving cylindrical support conveying stands; 711 and 805 gears for guiding cylindrical support conveying stands; 712 cylindrical support setting means; 808 a gear for rotating cylindrical support; 801 and 900 are outer walls of deposition chamber; 802 a gate valve; 806 a driving gear for rotting cylindrical support; 809 a cylindrical support rotating shaft; 811 a cylindrical support fixing implement; 807 a motor for rotating cylindrical support; 813 a motor for driving cylindrical conveying stand; 902 pipes for releasing gaseous starting material for formation of deposited film; 903 pipes for releasing gaseous halogenic oxidizing agent; 904 a gas releasing orifice.

Figure 6:
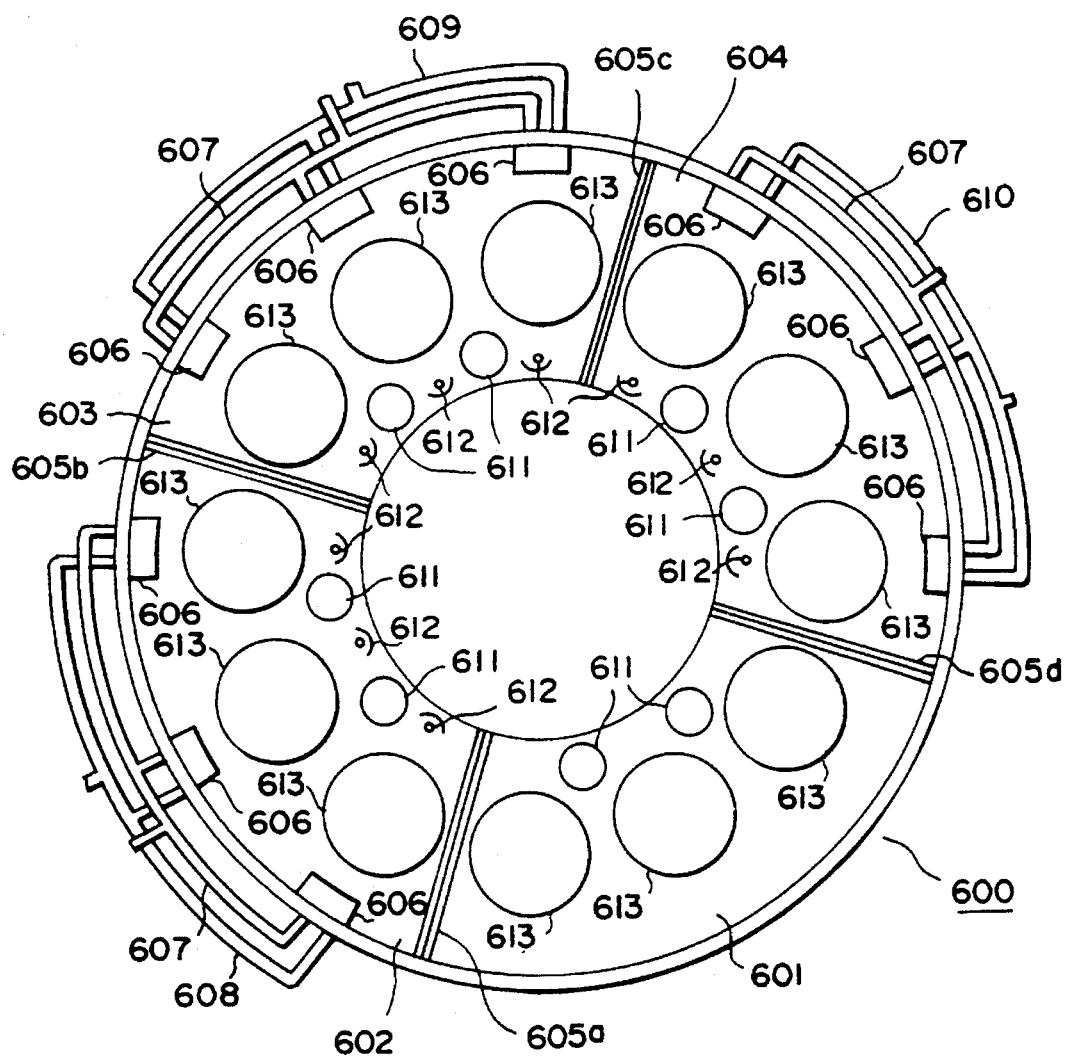
FIG. 6 illustrates schematically a sectional view of the device for forming deposited film according to a third embodiment of the present invention.

In FIG. 6, the device 600 for forming deposited film has a chamber for gateway of cylindrical supports 601, a first layer deposition chamber 602, a second layer deposition chamber 603, and a third layer deposition chamber 604 which are arranged in a circular form through gate valves 605a, 605b, 605c, and 605d. In the example shown in FIG. 6, introduction and discharging of cylindrical supports are performed in the chamber 601 for gateway of cylindrical supports, but said gateway chamber 601 may be separated into introduction and discharging chambers for cylindrical supports.

When separated into introduction and discharging chambers for cylindrical supports, they should be preferably positions adjacent to each other for increasing working efficiency.

Although rectangular type chambers may be available for the depositions chambers constituting the device for forming deposited film, arc type deposition chambers as shown in FIG. 6 are preferred for smaller area of the side wall and consequently smaller amount of degassing from the side wall as compared with other shapes.

Within the deposition chambers 602, 603, and 604, gas releasing means 606 are provided. The distance between said gas releasing means and cylindrical supports 613 should preferably be made several mm to 20 cm, more preferably about 5 mm to 15 cm.

Also, within the deposition chambers 602, 603, and 604, heating means for cylindrical supports 613 (IR lamps 612 for heating) are provided. The IR lamps 612 for heating cylindrical supports should preferably be provided on the opposite side to or on the same side as the gas releasing means with the cylindrical supports as the center.

Further, within the deposition chambers 602, 603, and 604, evacuating holes 611 are formed. The positions of the evacuating holes should preferably be formed on the wall surfaces on the opposite side to the gas releasing means with the cylindrical support as the center or on the lower wall surface, or alternatively between the cylindrical supports on the wall surface side opposite to the gas releasing means.

Figure 7:
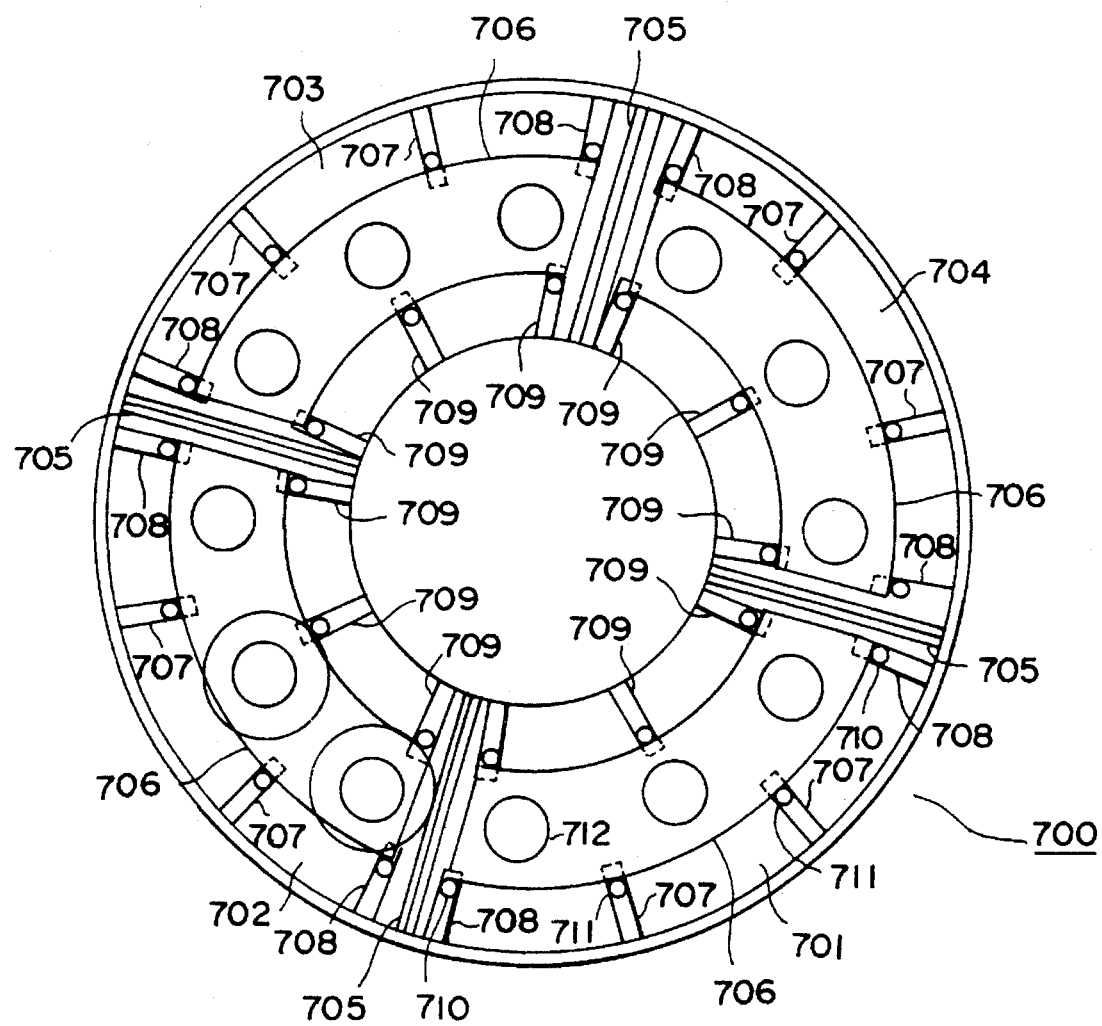
FIG. 7 illustrates schematically the cylindrical support conveying means of the device for forming deposited film shown in FIG. 6.

Next, the actuating mechanism of the device for forming deposited film shown in FIG. 6 is described by referring to FIG. 7.

Within the deposition chambers 702, 703, 704, and the chamber 701 for gateway of cylindrical supports, cylindrical support conveying means (cylindrical support conveying stands 706, cylindrical support conveying stand receivers 707, 708, and 709, cylindrical support conveying stand driving gears 710, and cylindrical support conveying stand guide gears) are provided. Cylindrical supports are provided on the cylindrical support conveying stands 706 which have said cylindrical supports mounted thereon and which are moved by means of the cylindrical support conveying stand driving gear 710.

Figure 8A:
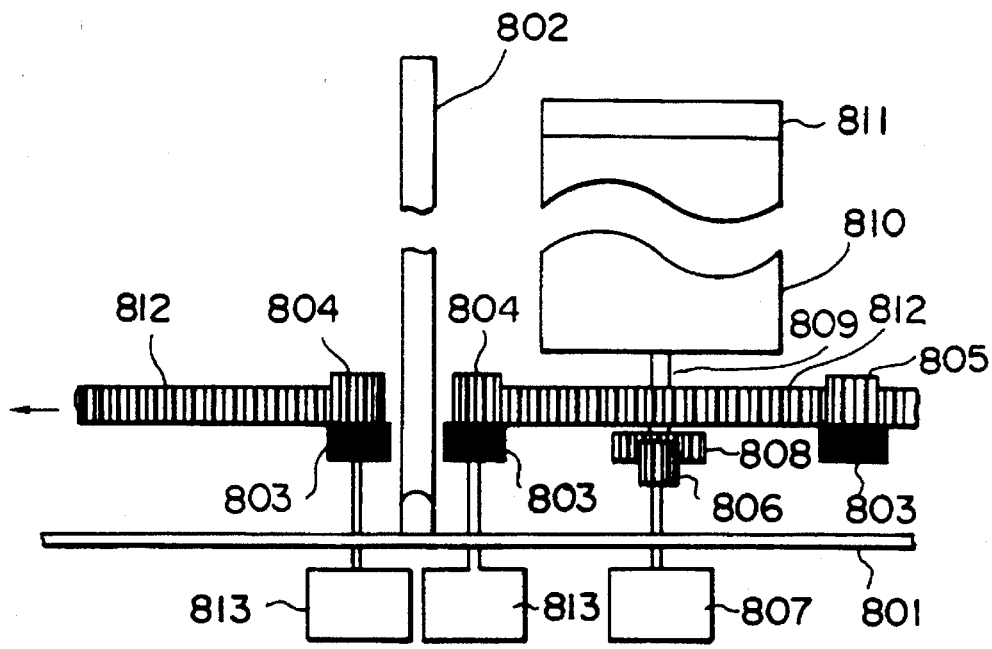
FIG. 8(A) and FIG. 8(B) illustrate schematically the actuation mechanism of the cylindrical support conveying means of the device for forming deposited film shown in FIG. 6.
Figure 8B:
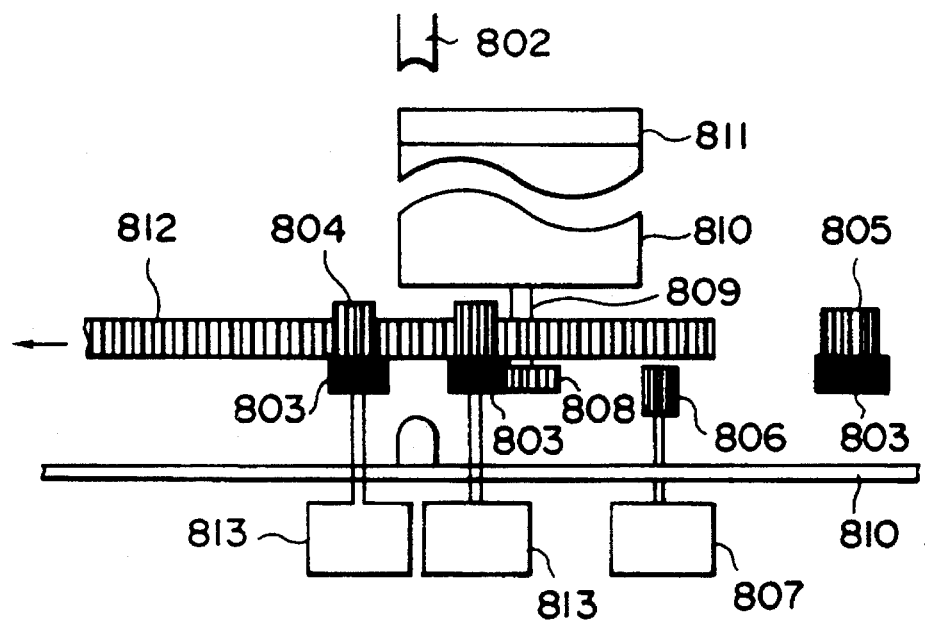

FIG. 8(A) shows the state before the cylindrical support conveying stand is moved. FIG. 8(B) shows the process in which said conveying stand is moved from the right deposition chamber to the left deposition chamber. First, the gate valve 802 is opened, and then the stand is moved by means of the cylindrical support conveying stand motor 813 through the driving gear 803.

Figure 9A:
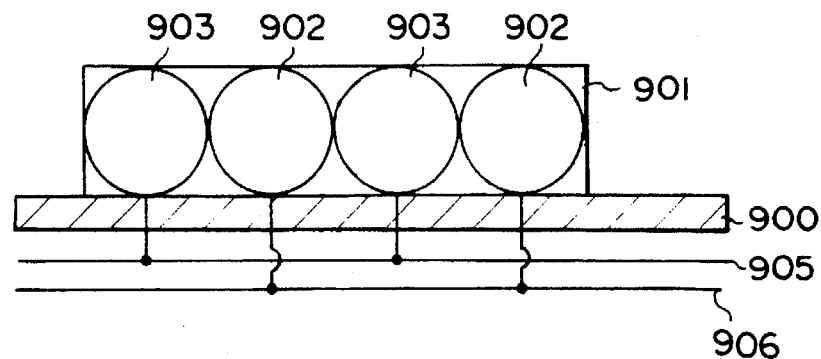
FIG. 9(A) and FIG. 9(B) illustrate schematically the gas releasing pipe placed in the deposition chamber of the device for forming deposited film shown in FIG. 6.
Figure 9B:
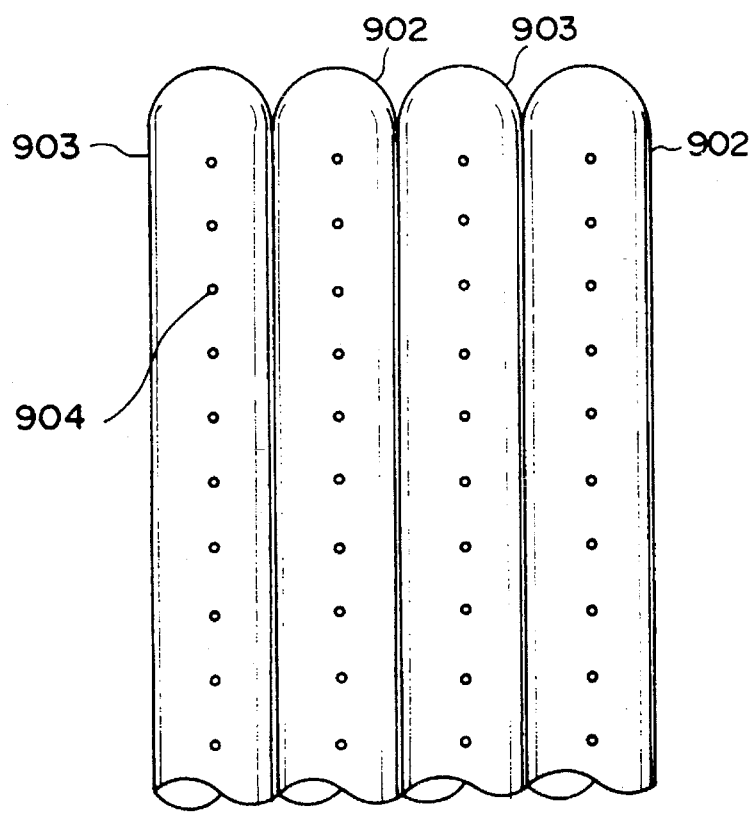

FIGS. 9(A) and (B) show one example of the gas releasing means of the device for formation of deposited film shown in FIG. 6.

The gas releasing means 901 is constituted of four gas releasing pipes 902 and 903. Two gas releasing pipes are pipes 902 for releasing gaseous starting materials for formation of deposited film, while the other two releasing pipes are pipes 903 for releasing gaseous halogenic oxidizing agents.

In each gas releasing pipe, gas releasing orifices are opened. The positions and the number of the gas releasing orifices are determined suitably depending on the position of the evacuation hole.

The present invention is described in more detail by referring to Examples.

EXAMPLE 1

Figure 10:
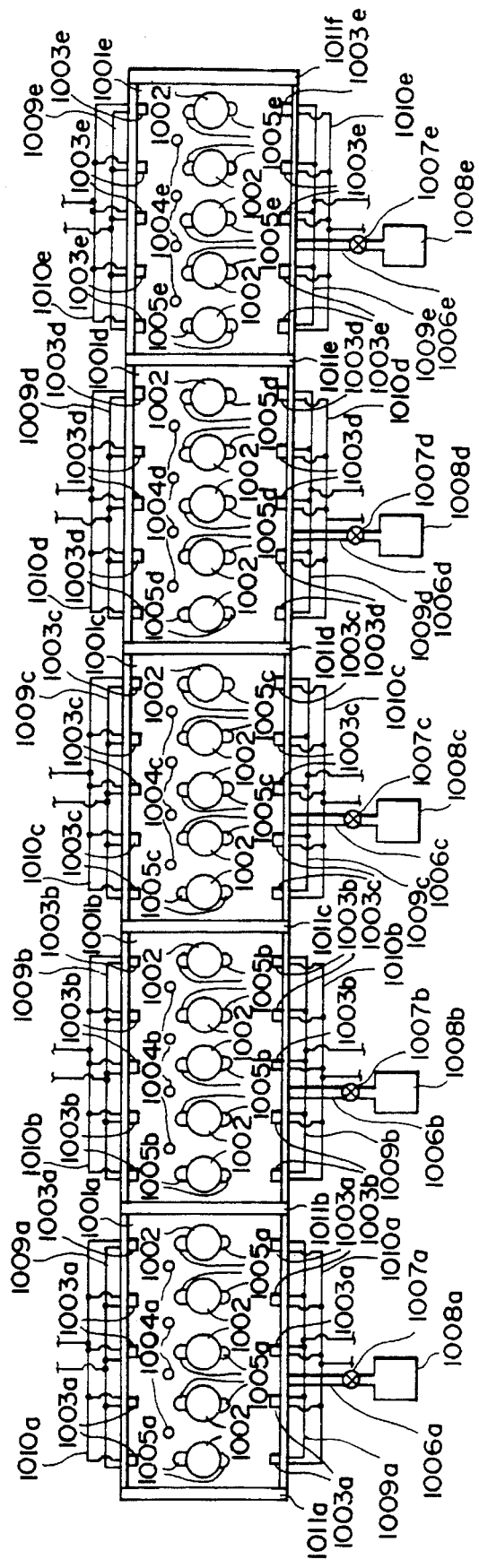
FIG. 10 and FIG. 11 illustrate schematically the constitutions of the devices used in Examples of the present invention.

By utilizing the device for forming deposited film schematically shown in FIG. 10, a photosensitive device for electrophotography utilizing amorphous silicon (a-Si:H) film was prepared.

Figure 2:
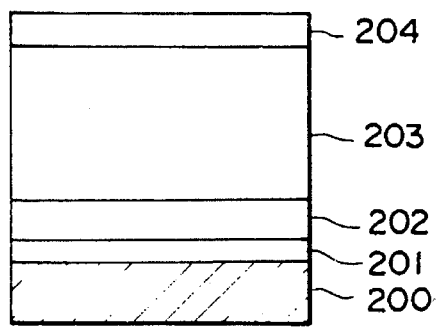
FIG. 2 illustrates schematically a layer constitution of a photosensitive device for electrophotography.

The layer constitution of the photosensitive device for electrophotography in this Example is shown in FIG. 2.

The device for forming deposited film shown in FIG. 10 has five chambers connected to each other with the chamber for formation of deposited film of the device for forming deposited film as described in FIG. 3(A), (B) being as one unit.

The respective portions of the device for forming deposited film shown in FIG. 10 have the following names.

1002 is a cylindrical substrate; 1003a–e are gas releasers; 1005a–e gas evacuation holes; 1006a–e gas collective evacuation pipes; 1007a–e main vacuum valves; 1008a–e evacuation devices; 1009a–e and 1010a–e gas feeding pipes; 1011a–f gate valves; 1001a is a pre-treatment chamber; 1001b a film forming chamber (1); 1001c a film forming chamber (2); 1001d a film forming chamber (3); 1001e a post-treatment chamber; 1004a, 1004b, 1004c, 1004d, and 1004e are halogen lamps for heating substrates and reflection mirrors.

In the following, the preparation steps are described in detail.

For the gas releaser, one having the shape shown in FIG. 4(1) was used. First, five cylindrical substrates made of aluminum of diameter 80 mm were carried in the pre-treatment chamber 1001a by opening the gate valve 1011a. The pre-treatment chamber 1001a was internally evacuated to about $10^{-3}$ Torr by means of the evacuation means 1008a, Ar gas was fed from the bomb (not shown) through the gas feeding pipe 1009a and the gas releasing orifice 1003a, and the inner pressure was maintained at 0.5 Torr by controlling the opening of the vacuum valve 1007a. The halogen lamps 1004a were lighted to set the substrate temperature at 250° C. During this operation, the substrate was rotated by the motor for driving. Next, introduction of Ar gas was stopped, and $F_2$ gas was introduced from the bomb (not shown) at 180 SCCM through the gas feeding pipe 1010a and the gas releasing orifice 1003a to effect cleaning by etching lightly the substrate surface. During this operation, the pressure in the pre-treatment chambers was maintained at 0.4 Torr. Introduction of $F_2$ gas was stopped and the pre-treatment chamber 1001a was evacuated to vacuum of about $10^{-6}$ Torr. During this operation, also the adjacent film forming chamber (1) 1001b was simultaneously evacuated by the evacuation device 1008b to vacuum of the same inner pressure as in the pre-treatment chamber 1001a. When the inner pressures became equal, the gate valve 1011b was opened and the substrate was conveyed into the film forming chamber (1) 1001b with being placed on the receiving stand for conveying substrate.

After the gate valve 1011b was closed, the halogen lamps 1004b for heating substrate were lighted to set the substrate temperature at 250° C. After the substrate temperature was stabilized, from the bombs (not shown), as the gaseous starting material (A) for forming deposited film, $SiH_4$ gas at 900 SCCM, $GeH_4$ 240 SCCM, and $B_2H_6$ (diluted to 1% with $H_2$) as the starting material (D) at 100 SCCM were fed through the gas feeding pipe 1009b, and also from the bombs (not shown), as the gaseous oxidizing agents, $F_2$ gas at 800 SCCM and NO gas at 250 SCCM, and He gas for dilution at 1400 SCCM through the gas feeding pipe 1010b, to be released through the gas releaser 1003b into the film forming chamber (1) 1001b, and a long wavelength absorbing layer was formed to 0.7 μm on the cylindrical substrate made of aluminum while maintaining the inner pressure at 0.7 Torr by controlling the opening of the main vacuum valve 1007b. Then, in the same manner except for stopping feeding only of $GeH_4$ gas, a charge injection preventive layer was formed continuously to 2.4 μm while maintaining the inner pressure at 0.7 Torr. After film formation, feeding of all the gases was stopped, and the film forming chamber (1) 1001b was internally evacuated to vacuum of about 10 Torr. During this operation, the adjacent film forming chamber (2) 1001c was also internally evacuated by means of the evacuation device 1008c to the same pressure as in the film forming chamber (1) 100 lb. When the inner pressures became equal, the gate valve 1011c was opened and the substrate was conveyed into the film forming chamber (2) 1001c with being placed on the receiving stand for conveying substrate.

After the gate valve 1011c was closed, the halogen lamps 1004c for heating substrate were lighted to set the substrate temperature to 250° C. After the substrate temperature was stabilized, from the bomb (not shown), $SiH_4$ gas was fed at 1800 SCCM through the gas feeding pipe 1009c, and also $F_2$ gas at 2200 SCCM and He gas at 2500 SCCM from the bombs (not shown) through the gas feeding pipe 1010c, to be released through the gas releaser 1003c into the film forming chamber (2) 1001c to form a photosensitive layer to 20 μm on the charge injection preventive layer while maintaining the inner pressure at 1.2 Torr by controlling the opening of the main vacuum valve 1007c. After the reaction, feeding of all the gases was stopped and the film forming chamber (2) was evacuated to vacuum of about 10 Torr. During this operation, the film forming chamber (3) 1001d was also internally evacuated at the same time by the evacuation device 1008d to the same inner pressure as in the film forming chamber (2) 1001c. When the inner pressures became equal, the gate valve 1011d was opened and the substrate was conveyed into the film forming chamber (3) 1001d with being placed on the receiving stand for conveying substrate.

After the gate valve 1011d was closed, the halogen lamps 1004d for heating substrate were lighted to set the substrate temperature to 250° C. After the substrate temperature was stabilized, from the bombs (not shown), $SiH_4$ gas at 220 SCCM and $C_2H_4$ gas at 1500 SCCM were fed through the gas feeding pipe 1009d and, also from the bombs (not shown), $F_2$ gas at 300 SCCM and He gas at 1200 SCCM were fed through the gas feeding pipe 1010d, to be released through the gas releaser 1003d into the film forming chamber (3) 1001d, and a surface protective layer was formed to 0.5 μm on the photosensitive layer while maintaining the inner pressure at 0.7 Torr by controlling the opening of the main vacuum valve 1007d. After the reaction, feeding of all the gases was stopped and the film forming chamber (3) 1001d was internally evacuated to vacuum of about $10^{-6}$ Torr. During this operation, the post-treatment chamber 1001e was also evacuated to vacuum to the same inner pressure as in the film forming chamber (3) 1001d. When the inner pressures became equal, gate valve 1011e was opened and the substrate was conveyed into the post-treatment chamber 1001e with being placed on the receiving stand for conveying substrate.

After the gate valve 1011e was closed, from the bomb (not shown), Ar gas was fed at 300 SCCM through the gas feeding pipe 1010e to be released through the gas releaser 1003e into the post-treatment chamber 1001e, and cooling was effected until the substrate temperature became room temperature. After the substrate temperature was sufficiently lowered, the main vacuum valve 1007e was closed, and the post-treatment chamber 1001e was internally purged with Ar gas to atmospheric pressure, followed by opening of the gate valve 1011f, and the photosensitive device for electrophotography completed was taken out.

Electrophotographic characteristics of the five photosensitive devices for electrophotography completed were evaluated as compared with the device prepared by a mass production device according to the conventional PCVD method. As the results, charging ability was improved by 14% or higher, and also sensitivety by 12% or higher. Characteristic irregularity in the circumferential direction and the vertical direction was 2% or lower. Characteristic irregularity among the five photosensitive devices for electrophotography was 5% or less, and the device for forming deposited film according of the present invention could satisfy fully the performances as a mass production machine.

EXAMPLE 2

Figure 11:
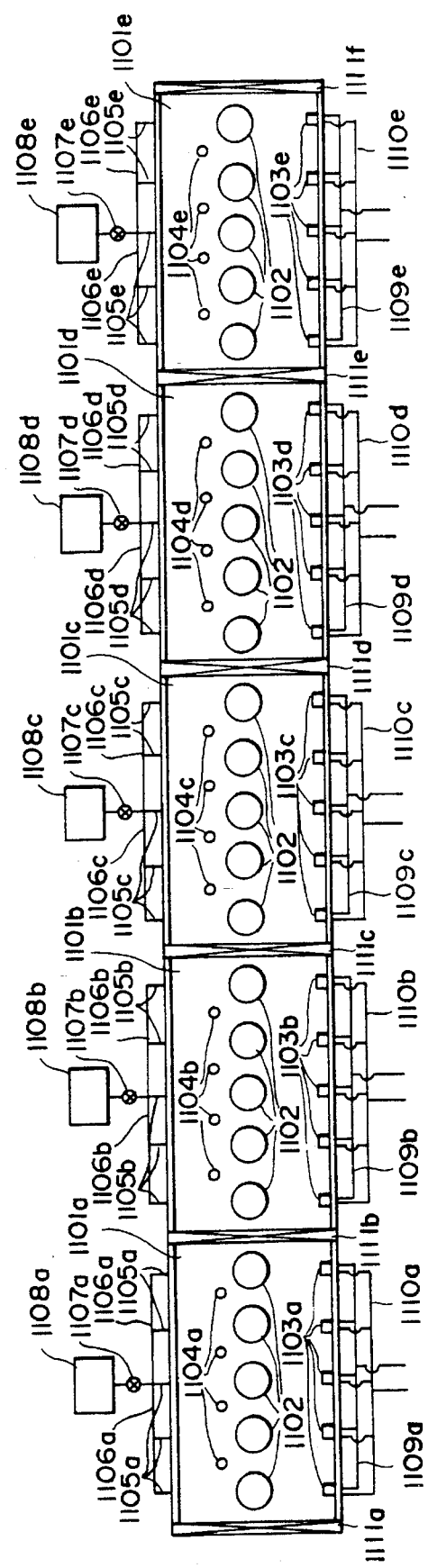

By utilizing the device for forming deposited film schematically shown in FIG. 11, a photosensitive device for electrophotography utilizing amorphous silicon (a-Si:H) film was prepared.

The layer constitution of the photosensitive device for electrophotography in this Example is shown in FIG. 2.

The device for forming deposited film shown in FIG. 11 has five chambers connected to each other with the chamber for formation of deposited film of the device for forming deposited film as described in FIG. 5(A), (B) being as one unit, and the respective portions have the following names.

1102 is a cylindrical substrate; 1103a–e are gas releasers; 1105a–e gas evacuation holes; 1106a–e gas collective evacuation pipes; 1107a–e main vacuum valves; 1108a–e evacuation devices; 1109a–e and 1110a–e gas feeding pipes; 1111a–f gate valves; 1101a is a pre-treatment chamber; 1101b a film forming chamber (1); 1101c a film forming chamber (2); 1101d a film forming chamber (3); 1101e a post-treatment chamber; 1104a, 1104b, 1104c, 1104d, and 1104e are halogen lamps for heating substrates and reflection mirrors.

In the following, the preparation steps are described in detail.

For the gas releaser, one having the shape shown in FIG. 4 (1) was used. First, five cylindrical substrates 1102 made of aluminum of diameter 80 mm were carried in the pre-treatment chamber 1101a by opening the gate valve 1111a. The pre-treatment chamber 1101a was internally evacuated to about 10 Torr by means of the evacuation means 1108a, Ar gas was fed from the bomb (not shown) through the gas feeding pipes 1109a and the gas releasing orifice 1103a, and the inner pressure was maintained at 0.5 Torr by controlling the opening of the vacuum valve 1107a. The halogen lamps 1104a were lighted to set the substrate temperature at 250° C. During this operation, the substrate was rotated by the motors for driving. Next, introduction of Ar gas was stopped, and from the bomb (not shown) $F_2$ gas was introduced at 100 SCCM through the gas feeding pipe 1110a and the gas releasing hole 1103a to effect cleaning by etching lightly the substrate surfaces. During this operation, the pressure in the pre-treatment chambers was maintained at 0.3 Torr. Introduction of $F_2$ gas was stopped and the pre-treatment chamber 1101a was evacuated to vacuum of about 10 Torr. During this operation, also the adjacent film forming chamber (1) 1101b was simultaneously evacuated by the evacuation device 1108b to vacuum of the same inner pressure as in the pre-treatment chamber 1101a. When the inner pressures became equal, the gate valve 1111b was opened and the substrate was conveyed into the film forming chamber (1) 1101b with being placed on the receiving stand for conveying substrate.

After the gate valve 1111b was closed, the halogen lamps 1104b for heating substrate were lighted to set the substrate temperature at 250° C. After the substrate temperature was stabilized, from the bombs (not shown), $SiH_4$ gas at 700 SCCM, $GeH_4$ at 180 SCCM, and $B_2H_6$ (diluted to 1% with $H_2$) at 100 SCCM were fed through the gas feeding pipe 1109b, and also from the bombs (not shown), as the gaseous oxidizing agents, $F_2$ gas at 600 SCCM, and NO gas at 200 SCCM and He gas for dilution at 1000 SCCM through the gas feeding pipe 1110b, to be released through the gas releaser 1103b into the film forming chamber (1) 1101b, and a long wavelength absorbing layer (a-Si:Ge:B:O:H:F) was formed to 0.7 μm on the cylindrical substrate made of aluminum while maintaining the inner pressure at 0.6 Torr by controlling the opening of the main vacuum valve 1107b. Then, in the same manner except for stopping feeding only of $GeH_4$ gas, a charge injection preventive layer (P+type a-Si:H:F:B:O) was formed continuously to 2.5 μm while maintaining the inner pressure at 0.6 Torr. After film formation, feeding of all the gases was stopped, and the film forming chamber (1) 1101b was internally evacuated to vacuum of about $10^{-6}$ Torr. During this operation, the adjacent film forming chamber (2) 1101c was also internally evacuated by means of the evacuation device 1108c to the same pressure as in the film forming chamber (1) 1101b. When the inner pressures became equal, the gate valve 1111c was opened and the substrate was conveyed into the film forming chamber (2) 1101c with being placed on the receiving stand for conveying substrate.

After the gate valve 1111c was closed, the halogen lamps 1104c for heating substrate were lighted to set the substrate temperature to 250° C. After the substrate temperature was stabilized, from the bomb (not shown), $SiH_4$ gas was fed at 1500 SCCM through the gas feeding pipe 1109c, and also from the bombs (not shown), $F_2$ gas at 1800 SCCM and He gas at 2000 SCCM through the gas feeding pipe 1110c, to be released through the gas releaser 1103c into the film forming chamber (2) 1101c to form a photosensitive layer (a-Si:H:F) 18 μm on the charge injection preventive layer while maintaining the inner pressure at 1 Torr by controlling the opening of the main vacuum valve 1107c. After the film formation, feeding of all the gases was stopped and the film forming chamber (2) 1101c was evacuated to vacuum of about $10^{-6}$ Torr. During this operation, the film forming chamber (3) 1101d was also internally evacuated at the same time by the evacuation device 1108d to the same inner pressure as in the film forming chamber (2) 1101c. When the inner pressures became equal, the gate valve 1111d was opened and the substrate was conveyed into the film forming chamber (3) 1101d with being placed on the receiving stand for conveying substrate.

After the gate valve 1111d was closed, the halogen lamps 1104d for heating substrate were lighted to set the substrate temperature to 250° C. After the substrate temperature was stabilized, from the bombs (not shown), $SiH_4$ gas at 150 SCCM and $C_2H_4$ gas at 1200 SCCM were fed through the gas feeding pipe 1109d and, also from the bombs (not shown), $F_2$ gas at 200 SCCM and He gas at 1000 SCCM were fed through the gas feeding pipe 1110d, to be released through the gas releaser 1103d into the film forming chamber (3) 1101d, and a surface protective layer (a-Si:C:H:F) was formed to 0.5 μm on the photosensitive layer while maintaining the inner pressure at 0.6 Torr by controlling the opening of the main vacuum valve 1107d. After film formation, feeding of all the gases was stopped and the film forming chamber (3) 1101d was internally evacuated to vacuum of about 10 Torr. During this operation, the post-treatment chamber 1101e was also evacuated to vacuum to the same inner pressure as in the film forming chamber (3) 1101d. When the inner pressures became equal, the gate valve 1111e was opened and the substrate conveyed into the post-treatment chamber 1101e with being placed on the receiving stand for conveying substrate.

After the gate valve 1111e was closed, from the bomb (not shown), Ar gas was fed at 200 SCCM through the gas feeding pipe 1110e to be released through the gas releaser 1103e into the post-treatment chamber 1101e, and cooling was effected until the substrate temperature became room temperature. After the substrate temperature was sufficiently lowered, the main vacuum valve 1107e was closed, and the post-treatment chamber 1101e was internally purged with Ar gas to atmospheric pressure, followed by opening of the gate valve 1111f, and the photosensitive device for electrophotography completed was taken out.

Electrophotographic characteristics of the five photosensitive devices for electrophotography completed were evaluated as compared with the device prepared by a mass production device according to the conventional PCVD method. As the results, charging ability was improved by 15% or higher, and also sensitivity by 13% or higher. Characteristic irregularity in the circumferential direction and the vertical direction was 3% or lower. Characteristic irregularity among the five photosensitive devices for electrophotography was 5% or less, and the device for forming deposited film according to the present invention could satisfy fully the performances as a mass production machine.

EXAMPLE 3

By use of a device having a structure similar to those described in FIG. 6 through FIG. 9(B), an image forming member having the constitution shown in FIG. 2 except having no layer 201 was prepared.

The layer constitution of the image forming member for electrophotography consists of an aluminum support 200, a charge injection preventive layer ($P^+$ type a-Si:H:F:B:O:N, thickness 3 μm) 202, a photosensitive layer (amorphous silicon layer, thickness 20 μm) 203, and a surface layer (a-Si:C:H:F, thickness 0.5 μm) 204.

The preparation method is described below.

First, three cylindrical supports made of aluminum (outer diameter 108 mm, length 350 mm, thickness 5 mm) were set on a stand for conveying cylindrical supports in the chamber for gateway of cylindrical supports 601, and the chamber for gateway of cylindrical supports 601 was closed, followed by evacuation to an inner pressure of $10^{-6}$ Torr by means of an evacuation pump (not shown).

Next, the gate valve was opened to a first layer deposition chamber 602 previously evacuated to $10^{-6}$ Torr by means of an evacuation pump (not shown), and the stand for conveying cylindrical supports was moved through a driving gear by a motor for driving the stand for conveying cylindrical supports, followed by closing of the gate valve 605a.

And, by means of the motor for rotating cylindrical supports, the cylindrical supports were rotated at one rotation/min., and at the same time, the supports were heated to a temperature of 280° C. by the IR-lamps for heating supports 612. After the temperature was stabilized, a first layer was deposited. The first layer was formed by feeding $F_2$ gas diluted to 10% with He gas from the gaseous halogenic oxidizing agent feeding pipe 607 at 1000 SCCM to the gas releasing means 606 to be introduced into the deposition chamber. 602. Similarly, from the starting material feeding pipe 608, $SiH_4$ gas containing 1000 ppm of $B_2H_6$ gas and 8% of NO gas was fed to the respective gas feeding means at 100 SCCM to be introduced into the deposition chamber 602. By controlling the evacuation pump, the inner pressure was made 0.8 Torr. Thus, by the oxidation reaction between the $F_2$ gas and the $SiH_4$ gas (containing $B_2H_6$, NO) introduced, a $P^+$ type amorphous silicon layer. (charge injection preventive layer) was formed to 3 μm on the Al support.

Next, introduction of gases into the deposition chamber 602 was stopped, the inner pressure in the deposition chamber was elevated to 10 Torr, the gate valve 605b was opened to a second layer deposition chamber 603 previously set to a support temperature of 280° C. by an IR-lamp and to $10^{-6}$ Torr, and the conveying stand having cylindrical supports mounted thereon was moved. And, similarly as in deposition of the first layer, $F_2$ gas diluted to 10% with He was introduced at 7000 SCCM and $SiH_4$ gas at 600 SCCM from respective gas releasing means into the deposition chamber 603. The inner pressure was made 0.8 Torr by controlling the evacuation pump.

Thus, the second layer (photosensitive layer) was deposited to 20 μm.

Further, similarly as the movement of the supports from the deposition chamber 602 to the deposition chamber 603, the supports were moved from the deposition chamber 603 to the deposition chamber 604, and a third layer (surface layer) was deposited in the deposition chamber 604. The third layer was formed by introducing $CH_4$ gas containing 10% of $SiH_4$ gas at 600 SCCM and $F_2$ gas diluted to 10% with He at 6000 SCCM from the respective gas releasing means into the deposition chamber 604. By controlling the evacuation pump, the inner pressure was made 0.6 Torr. And, by the oxidation reaction of $SiH_4$, $CH_4$, and $F_2$ gases, a third layer (amorphous silicon carbide layer) was formed to 0.5 μm.

After formation of the third layer, introduction of the gases into the deposition chamber 604 was stopped, the inner pressure made $10^{-6}$ Torr, and the supports were moved into the chamber for gateway 601 evacuated previously to $10^{-6}$ Torr.

After cooling the chamber for gateway 601, the supports having formed films thereon were taken out for evaluation of electrophotographic characteristics. It was found that charging ability was improved by 10% and also sensitivity by 10% as compared with the image forming member for electrophotography prepared by the conventional mass production machine.

All of the three image forming members for electrophotography exhibited substantially the same characteristics. Irregularity in charging ability, sensitivity in the vertical direction was 1% or less.

Also, when the image forming members for electrophotography were analyzed by SIMS, the amount of oxygen in the photosensitive layer was found to be reduced by 30% as compared with the image forming member for electrophotography prepared by the conventional mass production machine.

As described in detail above, particularly the following effects can be obtained according to the present invention.

That is, according to the device for forming deposited film of the present invention, without use of plasma reaction, energy saving can be effected simultaneously with full satisfaction of enlargement of area, uniformity in film thickness and uniformity in film quality, and also a multi-layer constitution deposited film improved in interface characteristics can be continuously formed with simplification of management and mass productivity, without requiring enormous installation investment for mass production device, and also with clear management items for mass production thereof as well as broad management tolerance and simple control of the device.

More specifically, the following advantages are included (1) Since a large number of film formations can be performed at one time in one device for forming deposited film, the device cost is cheap.

(2) Since the gas flow can be maintained linearly from introduction to discharging, uniformity in film thickness and film quality can be improved.

(3) Since the gaseous starting materials and the gaseous oxidizing agents can be mixed with good efficiency, the reaction efficiency is good, and the utilization efficiency of the gases is higher.

(4) Since no energy is required externally other than heating of the support, running cost of the device is cheap.

(5) Since the respective deposited layers can be formed in separate chambers for formation of deposited film during formation of a deposited film of a multi-layer constitution, the interface characteristics can be improved.

(6) By making the conveying direction of the substrate one direction, continuous production is rendered possible.

In addition, in the case of the third embodiment, there are the following advantages.

(7) Since introduction and discharging of the support can be done at the same or proximate places, the working efficiency is good.

(8) Since the deposition chambers are arranged in a circular form, the distances for pipelines for feeding and discharging gases are made shorter, whereby the amounts of impurities entrained become smaller.

We claim:

1. An apparatus for forming a deposited film on a substrate by bringing a gaseous starting material for forming the deposited film into contact with a gaseous oxidizing agent having the property of oxidizing said gaseous starting material thereby to form said deposited film comprising:

a plural number of chambers in which to form the deposited film, said chambers arranged in a circular form and being in communication with adjacent chambers through a gas mixing preventing means positioned therebetween, each of said chambers including:

a gas releasing means including a plurality of first orifices for introducing said gaseous starting material to said chamber and a plurality of second orifices for introducing said gaseous oxidizing agent to said chamber, said plurality of first orifices and said plurality of second orifices being positioned alternately to each other in said chamber to create a sufficient reaction mixture between said gaseous starting material and said gaseous oxidizing agent to generate a plurality of precursors including at least one excited precursor in an excited state, wherein said at least one precursor functions as the feeding source for the constituent element of said film;

said gaseous starting material being at least one selected from the group consisting of straight chain silane compounds having the formula $Si_nH_{2n-2}$ where n=1 to 8, $SiH_3SiH(SiH_3)SiH_2SiH_3$, and cyclic silane compounds having the formula $Si_mH_{2m}$, where m=3, 4, 5, 6;

said gaseous oxidizing agent being at least one selected from the group consisting of oxygen, ozone, air, $N_2O_4$, $N_2O_3$, $NO_2$, NO, $H_2O_2$, $F_2$, $Cl_2$, $Br_2$, $I_2$ and ClF;

means for positioning said substrate in each of said plurality of chambers;

means for conveying said substrate;

means for heating said substrate; and an exhaust opening which communicates with said chamber.

2. The apparatus according to claim 1, wherein said oxidizing agent is a halogenic oxidizing agent.

3. The apparatus according to claim 1, wherein the gas-mixing preventing means comprises a gate valve.

4. The apparatus according to claim 1, wherein said substrate is cylindrical.

5. The apparatus according to claim 1, further comprising a chamber which is not used for film formation and which communicates with at least one of said plurality of chambers through a gas-mixing preventing means.

6. The apparatus according to claim 5, wherein the gas-mixing preventing means comprises a gate valve.

7. The apparatus according to claim 5, wherein the chamber not used for film formation functions as at least one of a substrate incorporating chamber and a substrate withdrawing chamber.

8. The apparatus according to claim 5, wherein the chamber not used for film formation communicates with at least two of said plurality of chambers adjacent thereto.

9. The apparatus according to claim 5, wherein said plurality of chambers comprise a charge injection preventive layer forming chamber, a photosensitive layer forming chamber and a surface layer forming chamber.

10. The apparatus according to claim 9, wherein the charge injection preventive layer forming chamber and the surface layer forming chamber communicate with the chamber not used for film formation through a gas-mixing preventing means.

11. The apparatus according to claim 10, wherein the gas-mixing preventing means comprises a gate valve.

12. The apparatus according to claim 9, wherein the charge injection preventive layer forming chamber, the photosensitive layer forming chamber and the surface layer forming chamber are positioned in the named order.

\* \* \* \* \*

UNITED STATES PATENT AND TRADEMARK OFFICE
CERTIFICATE OF CORRECTION

PATENT NO. : 5,482,557
DATED : January 9, 1996
INVENTOR(S) : MASAHIRO KANAI ET AL.

Page 1 of 4

It is certified that error appears in the above-identified patent and that said Letters Patent is hereby corrected as shown below:

On the title page, item

AT [75] INVENTORS

"Tokyo" should read --Kyoto--.

COLUMN 1

Line 50, "fewer" should read --lower--.

COLUMN 2 line 16, "141-1, 141-2" should read --114-1, 114-2--.

COLUMN 3

Line 54, "presently" should read --presently as--.

COLUMN 7

Line 10, "$BiH_3$," should read --$BH_3$,--.
Line 59, "(S=1," should read --(s=1,--.

COLUMN 8

Line 44, "pressure" should read --pressures--.
Line 45, "$1X10^{-7}$ atom" should read --$1X10^{-7}$ atmospheres--.
Line 46, "atom," should read --atmospheres,-- and --"$1X10$ atom to 2 atom." should read --$1X10^{-6}$ atmospheres to 2 atmospheres.--.

UNITED STATES PATENT AND TRADEMARK OFFICE
CERTIFICATE OF CORRECTION

PATENT NO. : 5,482,557
DATED : January 9, 1996
INVENTOR(S) : MASAHIRO KANAI ET AL.

It is certified that error appears in the above-identified patent and that said Letters Patent is hereby corrected as shown below:

COLUMN 9

Line 62, "set" should read --arranged--.
Line 63, "on" should be deleted.

COLUMN 11

Line 54, "slit" should read --slits--.

COLUMN 12

Line 28, "flow" should read --direction of conveying the--.
Line 40, "materail" should read --material--.

COLUMN 13

Line 17, "703" should read --803--.
Line 18, "704" should read --804--.
Line 23, "rotting" should read --rotating--.
Line 43, "positions" should read --positioned--.

COLUMN 14

Line 11, "gears)" should read --gears 711)--.
Line 30, "releasing" should read --gas releasing--.

UNITED STATES PATENT AND TRADEMARK OFFICE
CERTIFICATE OF CORRECTION

PATENT NO. : 5,482,557
DATED : January 9, 1996
INVENTOR(S) : MASAHIRO KANAI ET AL.

Page 3 of 4

It is certified that error appears in the above-identified patent and that said Letters Patent is hereby corrected as shown below:

COLUMN 15

Line 2, "substrates" should read --substrates 1002--.
Line 49, "10" should read --$10^{-6}$--.
Line 53, "(1) 100 lb." should read --(1) 1001b.--.

COLUMN 16

Line 5, "10 Torr." should read --$10^{-6}$ Torr.--.
Line 51, "results," should read --result,--.
Line 52, "sensitivety" should read --sensitivity--.
Line 57, "of" should read --to--.

COLUMN 17

Line 25, "10 Torr" should read --$10^{-3}$ Torr-- and --means 1108a," should read --device 1108a,--.
Line 40, "10 Torr." should read --$10^{-6}$ Torr.--.
Line 65, "(P+type" should read --($P^+$type--.

COLUMN 18

Line 49, "10 Torr." should read --$10^{-6}$ Torr.--.

UNITED STATES PATENT AND TRADEMARK OFFICE
CERTIFICATE OF CORRECTION

PATENT NO. : 5,482,557
DATED : January 9, 1996
INVENTOR(S) : MASAHIRO KANAI ET AL.

It is certified that error appears in the above-identified patent and that said Letters Patent is hereby corrected as shown below:

COLUMN 19

Line 5, "method ." should read --method.-- and "results," should read --result,--.
Line 41, "And, by" should read --By--.
Line 58, "layer." should read --layer--.
Line 63, "10 Torr," should read --$10^{-6}$ Torr,--.

Signed and Sealed this

Third Day of February, 1998

Attest:

BRUCE LEHMAN

Attesting Officer    Commissioner of Patents and Trademarks